(12) United States Patent
Abe et al.

(10) Patent No.: US 9,165,214 B2
(45) Date of Patent: Oct. 20, 2015

(54) IMAGE PROCESSING DEVICE AND COMPUTER PROGRAM

(75) Inventors: Yuichi Abe, Mito (JP); Hiroyuki Shindo, Hitachinaka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 137 days.

(21) Appl. No.: 13/818,097
(22) PCT Filed: Aug. 31, 2011
(86) PCT No.: PCT/JP2011/069753
§ 371 (c)(1),
(2), (4) Date: Feb. 20, 2013
(87) PCT Pub. No.: WO2012/029844
PCT Pub. Date: Mar. 8, 2012

(65) Prior Publication Data
US 2013/0148876 A1 Jun. 13, 2013

(30) Foreign Application Priority Data
Aug. 31, 2010 (JP) ................................ 2010-193077

(51) Int. Cl.
*G06K 9/34* (2006.01)
*A61N 5/00* (2006.01)
(Continued)

(52) U.S. Cl.
CPC ..... *G06K 9/62* (2013.01); *G01B 15/04* (2013.01); *H01J 37/28* (2013.01); *H01J 2237/221* (2013.01); *H01J 2237/248* (2013.01); *H01J 2237/2817* (2013.01)

(58) Field of Classification Search
CPC .............. G06T 2207/30148; G06T 7/001; G06T 2207/10056; G06T 7/0028; G06T 2207/10061; G06T 7/0006; H01J 37/28; H01J 2237/2817; H01J 37/222; H01J 2237/221; H01J 2237/24578; H01J 2237/24592; H01J 2237/248; G06K 9/6203; G06K 9/62; G01B 15/04; G01B 21/20

USPC ......... 382/144, 145, 149, 151, 165, 168, 173, 382/181, 190, 197, 195, 203, 201, 206, 209, 382/216, 253, 251, 266, 296, 295, 300; 250/492.22, 307, 306, 310, 311, 492.2
See application file for complete search history.

(56) References Cited

U.S. PATENT DOCUMENTS 7,923,703 B2 * 4/2011 Morokuma et al. ..... 250/492.22
8,036,455 B2 * 10/2011 Hayaishi ..................... 382/162
(Continued)

FOREIGN PATENT DOCUMENTS

JP    10-222672 A    8/1998
JP    2006-119927 A    5/2006
(Continued)

OTHER PUBLICATIONS

International Search Report ssued in International Application No. PCT/JP2011/069753 mailed Oct. 11, 2011.

*Primary Examiner* — Sheela Chawan
(74) *Attorney, Agent, or Firm* — McDermott Will & Emery LLP

(57) ABSTRACT

The purpose of the present invention is to provide an image processing apparatus and a computer program such that correspondence points between design data and an edge line or between edge lines can be accurately identified for their matching. In an embodiment for achieving the purpose, when positioning between a first pattern formed by a first line segment and a second pattern formed by a second line segment is performed, a first correspondence point and a second correspondence point are set on the first line segment and the second line segment, respectively; a degree of alignment for performing the positioning of the first pattern and the second pattern is calculated on the basis of the distance between the first correspondence point and the second correspondence point; and the position of the first correspondence point and/or the second correspondence point is changed in accordance with a shape difference between the first line segment and the second line segment (see FIG. 2).

19 Claims, 31 Drawing Sheets

(51) Int. Cl.
*G06K 9/62* (2006.01)
*G01B 15/04* (2006.01)
*H01J 37/28* (2006.01)

(56) References Cited

U.S. PATENT DOCUMENTS

| | | | |
|---|---|---|---|
| 8,094,920 B2 | 1/2012 | Sugiyama et al. | |
| 8,173,962 B2 * | 5/2012 | Sutani et al. | 250/307 |
| 8,507,856 B2 * | 8/2013 | Sutani et al. | 250/307 |
| 8,515,153 B2 * | 8/2013 | Sugiyama et al. | 382/141 |
| 2006/0110042 A1 | 5/2006 | Onishi et al. | |
| 2006/0193508 A1 | 8/2006 | Sutani et al. | |
| 2009/0087103 A1 | 4/2009 | Abe et al. | |

FOREIGN PATENT DOCUMENTS

| | | |
|---|---|---|
| JP | 2006-234588 A | 9/2006 |
| JP | 2007-079982 A | 3/2007 |
| JP | 2009-086920 A | 4/2009 |
| WO | WO-2007/094439 A1 | 8/2007 |

* cited by examiner (a)

(b)

(c)

(d)

(e)

(f)

(a)

(b)

Edge line shape     Signed distance transform image     0-level contour line (a)

(b)

(c)

(d)

(a)  (b)
(c)  (d)

| 1 | 0 | -1 |
|---|---|----|
| 2 | 0 | -2 |
| 1 | 0 | -1 |

| -1 | -2 | -1 |
|----|----|----|
| 0  | 0  | 0  |
| 1  | 2  | 1  |

(a)

(b)

(c)

(a)

(b)

(c)

(a)

(b)

Weight

IMAGE PROCESSING DEVICE AND COMPUTER PROGRAM

RELATED APPLICATIONS

This application is the U.S. National Phase under 35 U.S.C. §371 of International Application No. PCT/JP2011/069753, filed on Aug. 31, 2011, which in turn claims the benefit of Japanese Application No. 2010-193077, filed on Aug. 31, 2010, the disclosures of which Applications are incorporated by reference herein.

TECHNICAL FIELD

The present invention relates to an image processing apparatus and a computer program for causing a computing apparatus to perform image processing. Particularly, the present invention relates to an image processing apparatus and a computer program for performing positioning between two edge lines or between an edge line and design data (layout data).

BACKGROUND ART

With the recent progress in miniaturization technology for semiconductor device manufacturing, the patterns formed on a semiconductor wafer have been miniaturized, and increasingly higher accuracy is required for apparatuses that evaluate the miniaturized patterns. Particularly, the advance in OPC (Optical Proximity Correction) technology has created increasing demand for evaluating the two-dimensional shape of a pattern. In order to accurately measure or inspect a fine pattern, a charged particle beam apparatus represented by the scanning electron microscope (SEM) is used. In an image acquired by a SEM and the like, a pattern edge portion is represented with a certain width. As a method for accurately ascertaining the edge shape of a pattern, an edge line determination technology is known. Patent Literatures 1 and 2 disclose methods for performing pattern matching between an edge line and design data so as to accurately measure a shape difference between design data and edge line.

CITATION LIST

Patent Literature

Patent Literature 1: WO2007/094439
Patent Literature 2: JP Patent Publication (Kokai) No. 2007-79982 A

SUMMARY OF INVENTION

Technical Problem

In the pattern matching methods according to Patent Literatures 1 and 2, matching between the edge line and design data may be achieved with some accuracy when there is a shape difference between them. However, matching accuracy may be decreased unless the correspondence between an edge line portion and a design data portion that are to be positioned is accurately determined. For example, when it is desired to determine a correspondence point for the design data on a straight line with the edge line as the base point, the correspondence point may be set at a location that should not be considered a correspondence point in the first point, depending on the shape of the edge line. Setting the correspondence point at a wrong position may result in a decrease in matching accuracy.

In the following, an image processing apparatus and a computer program for accurately identifying correspondence points between design data and edge line or between edge lines for their matching will be described.

Solution to Problem

In order to achieve the object, an embodiment proposes an image processing apparatus including a positioning process unit for performing positioning between a first pattern formed by a first line segment and a second pattern formed by a second line segment. The positioning process unit sets a first correspondence point and a second correspondence point on the first line segment and the second line segment, respectively, calculates a degree of alignment for the positioning of the first pattern and the second pattern on the basis of the distance between the first correspondence point and the second correspondence point, and changes the position of the first correspondence point and/or the second correspondence point in accordance with a shape difference between the first line segment and the second line segment. A computer program for causing a computing apparatus to perform such processes is also proposed.

According to a more specific embodiment, the positioning process unit may set the first correspondence point and the second correspondence point on a third line segment connecting the first and the second line segments at points of intersection with the first line segment and the second line segment, and change the position of the first correspondence point and/or the second correspondence point set on the third line segment by changing the shape of the third line segment in accordance with the shape difference between the first line segment and the second line segment.

A further embodiment proposes an image processing apparatus comprising a positioning process unit for performing positioning between a first pattern formed by a first line segment and a second pattern formed by a second line segment. The positioning process unit sets a first correspondence point and a second correspondence point on the first line segment and the second line segment, respectively, calculates a degree of alignment for the positioning of the first pattern and the second pattern on the basis of the distance between the first correspondence point and the second correspondence point, and, when a plurality of the first correspondence points and the second correspondence points is set, forms a plurality of third line segments connecting the first correspondence points and the second correspondence points in a non-intersecting manner. A computer program for causing a computing apparatus to perform such processes is also proposed.

Advantageous Effects of Invention

According to the above configurations, correspondence points between two patterns can be identified in accordance with a shape difference between the patterns, so that accurate positioning can be performed by using accurate correspondence points.

DESCRIPTION OF EMBODIMENTS

Figure 45:
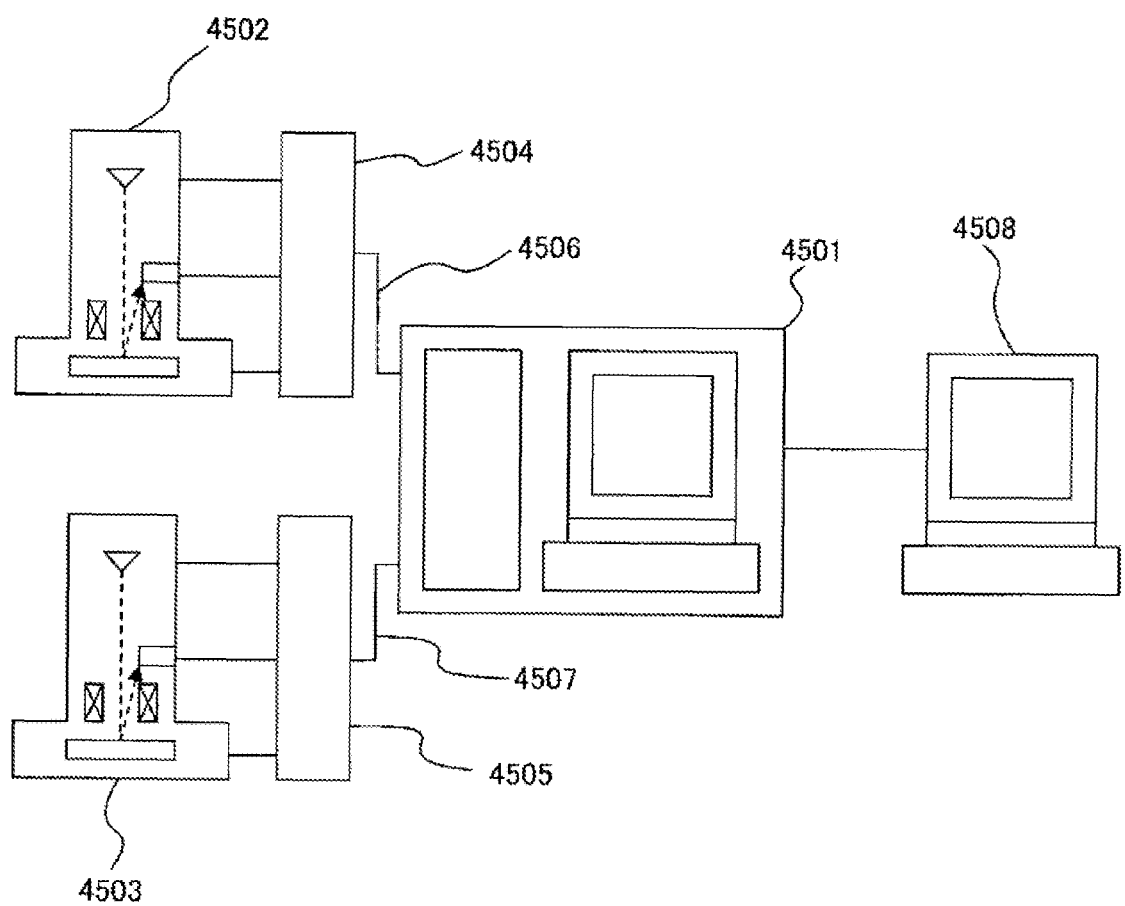
FIG. 45 illustrates an example of a semiconductor measurement or inspection system including a plurality of SEMs.

In the following, an image processing apparatus for performing positioning between line segments forming two patterns will be described with reference to the drawings. FIG. 45 illustrates a semiconductor measurement or inspection system including a plurality of SEMs. In the system illustrated in FIG. 45, an edge line is extracted from an object image such as an SEM image taken of a semiconductor pattern, and then the pattern is measured or inspected by using the edge line data. For example, the extracted edge line is compared with design data (which may be referred to as "layout data") to evaluate the quality of the semiconductor pattern or calibrate an OPC model. A measuring method for determining the measurement between design data and an edge line, which may be referred to as an "EPE (Edge Placement Error) measuring method, is used for determining manufacturing process conditions or for feedback of the semiconductor pattern to design data, by monitoring the discrepancy between the design data, i.e., an ideal shape of the pattern, and the actual pattern shape information extracted from the SEM image.

The measurement or inspection system of FIG. 45 illustrates a system in which the plurality of SEMs is connected to a data managing apparatus 4501 at the center. Particularly, in the present embodiment, an SEM 4502 is mainly used for measuring or inspecting a photomask or reticle pattern used for a semiconductor exposing process. An SEM 4503 is mainly used for measuring or inspecting a pattern transferred onto a semiconductor wafer by exposure using the photomask and the like. The SEMs 4502 and 4503, which are not much different from each other in terms of basic structure as an electron microscope, are adapted for different sizes of the semiconductor wafer and the photomask or for differences in resistance against charging.

To the SEM 4502 and the SEM 4503, control apparatuses 4504 and 4505 are connected, respectively, for performing control necessary for the SEMs. In each of the SEMs, an electron beam emitted from an electron source is focused by a plurality of stages of lenses, and a sample is scanned with the focused electron beam one- or two-dimensionally by a scanning deflector.

Secondary electrons (SE) released from the sample as it is scanned by the electron beam, or backscattered electrons (BSE) are detected by a detector whose output is stored in a storage medium, such as a frame memory, in synchronism with the scan by the scanning deflector.

The above control and the like are performed in the control apparatuses 4504 and 4505 for the respective SEMs, and an image or signal obtained as a result of the electron beam scan is sent to the data managing apparatus 4501 via communication lines 4506 and 4507. While in the present example the control apparatuses for controlling the SEMs and the data managing apparatus that performs measurement on the basis of the signal obtained by the SEMs are described as being separate, this is merely exemplary. Control of the apparatus and the measuring process may be performed together in the data managing apparatus, or control of the SEMs and the measuring process may be performed together in each control apparatus. In other words, a positioning process for two patterns which will be described below may be performed by the data managing apparatus 4501, or by the control apparatuses 4504 and 4505. In this case, a dedicated computing apparatus for performing the positioning (pattern matching), or a computing apparatus that operates in accordance with a computer program, may be built inside the data managing apparatus 4501 or the control apparatuses 4504 and 4505. Namely, the computing apparatus built inside these devices functions as a positioning process unit.

The data managing apparatus or the control apparatuses include a program stored therein for executing the measuring process, so that measurement or computation can be performed in accordance with the program. Further, the design data managing apparatus includes design data stored therein for a photomask (which may be hereafter simply referred to as a "mask") or a wafer used in a semiconductor manufacturing process. The design data is expressed in a GDS format or an OASIS format, for example, and stored in a predetermined form. The type of the design data is not particularly limited as long as the software for displaying the design data can display the data in the particular format and handle the design data as graphic data. The design data may be stored in a storage medium provided separately from the data managing apparatus.

To the data managing apparatus 4501, a simulator 4508 is connected. The simulator 4508 includes a program for creating a pattern layout on the basis of the design data stored in an external storage medium or the data managing apparatus 4501, semiconductor manufacturing process conditions and the like. The simulator 4508 also includes a computing apparatus for executing the program. The simulator 4508 is configured to transmit layout data after simulation to the data managing apparatus. While the present embodiment is based on the example in which simulation is performed in the simulator 4508, this is merely exemplary, and simulation may be performed in the data managing apparatus 4501 by executing the program.

The data managing apparatus 4501 is provided with a function of creating a program (recipe) for controlling the operation of the SEMs on the basis of semiconductor design data. Thus, the data managing apparatus 4501 also functions as a recipe setting unit. Specifically, the data managing apparatus 4501 creates a program for setting positions and the like for performing processes required by the SEMs, such as desired measurement points or auto-focus, automatic astigmatism correction, and addressing points on design data, edge line data for a pattern, or simulated design data, and then automatically controlling a sample stage, the deflector and the like of the SEMs on the basis of the settings.

As will be described later, the data managing apparatus 4501 is configured to store a data base in which design data for a semiconductor device are registered, or access design data stored in an external storage medium, so that necessary data can be read from the data base in accordance with an arbitrary setting.

As described above, the data managing apparatus 4501 and the like includes the computing apparatus for identifying the relative positional relationship between an SEM image pattern and design data for EPE measurement. According to the present embodiment, an example will be described in which, particularly for performing positioning between an edge line and design data, or between edge lines, a process is performed in which respective correspondence points are determined such that the distance between the correspondence points satisfies a predetermined condition (such as the distance being minimized; the sum of distances between a plurality of correspondence points being minimized; or the total of distances between partially weighted correspondence points being minimized). Such positioning may be performed by using a gradation image created from design data; however, in the case of pattern matching between an SEM image pattern and design data, positioning may be biased when the SEM image pattern is greatly varied with respect to the design data.

Figure 1:
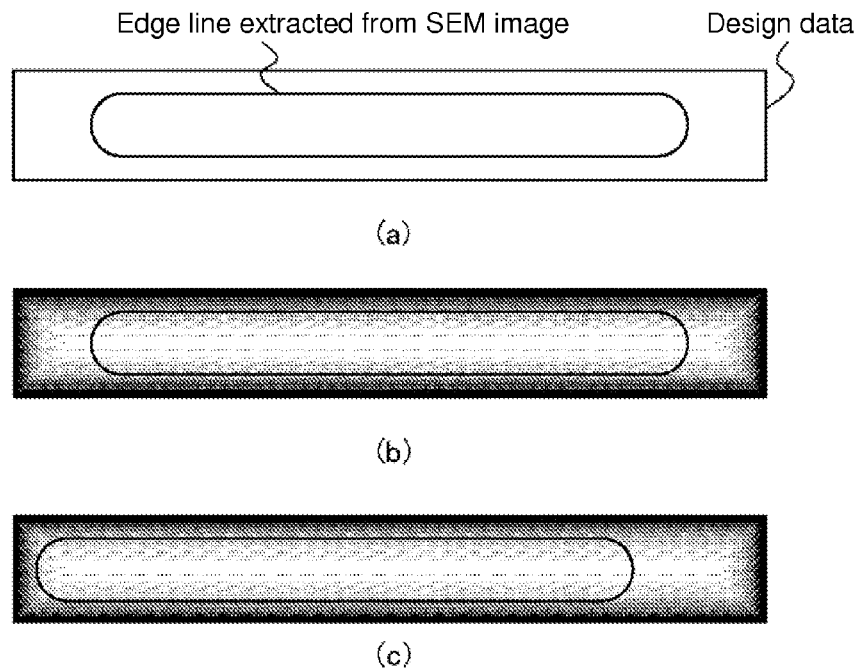
FIG. 1 illustrates an example of pattern matching by using a gradation image.

FIG. 1 shows such an example. FIG. 1(a) shows a desirable positioning result for design data and an edge line extracted from an SEM image. FIG. 1(b) shows an example in which the edge line extracted from the SEM image is superposed on a gradation image of the design data at the position of (a). FIG. 1(c) shows an example in which the edge line extracted from the SEM image is superposed on the gradation image of the design data at an undesirable position. The dispersion of pixel values of the gradation image at the position of the edge line in (b) is greater than the corresponding dispersion in (c).

In the present embodiment, in order to accurately perform positioning between two patterns formed by two line segments (design data and an edge line, or an edge line and an edge line), a method for performing the positioning by identifying correspondence points and for accurately performing the identification of the correspondence points will be described. The reference for positioning is not limited to design data and may include a simulated contour generated from the design data through litho simulation by the above-described simulator, or general edge line data. A method for extracting an edge line from a SEM image will be described with reference to FIGS. 46 and 47.

Figure 46:
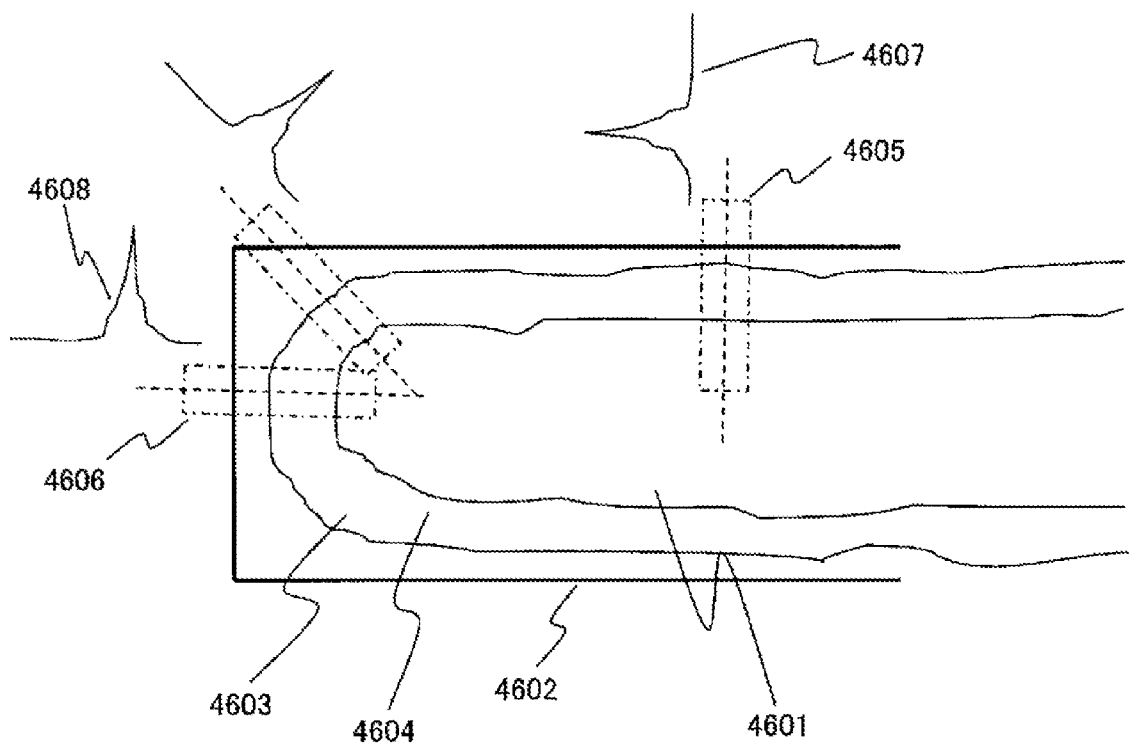
FIG. 46 illustrates an example of an edge line extraction method.
Figure 47:
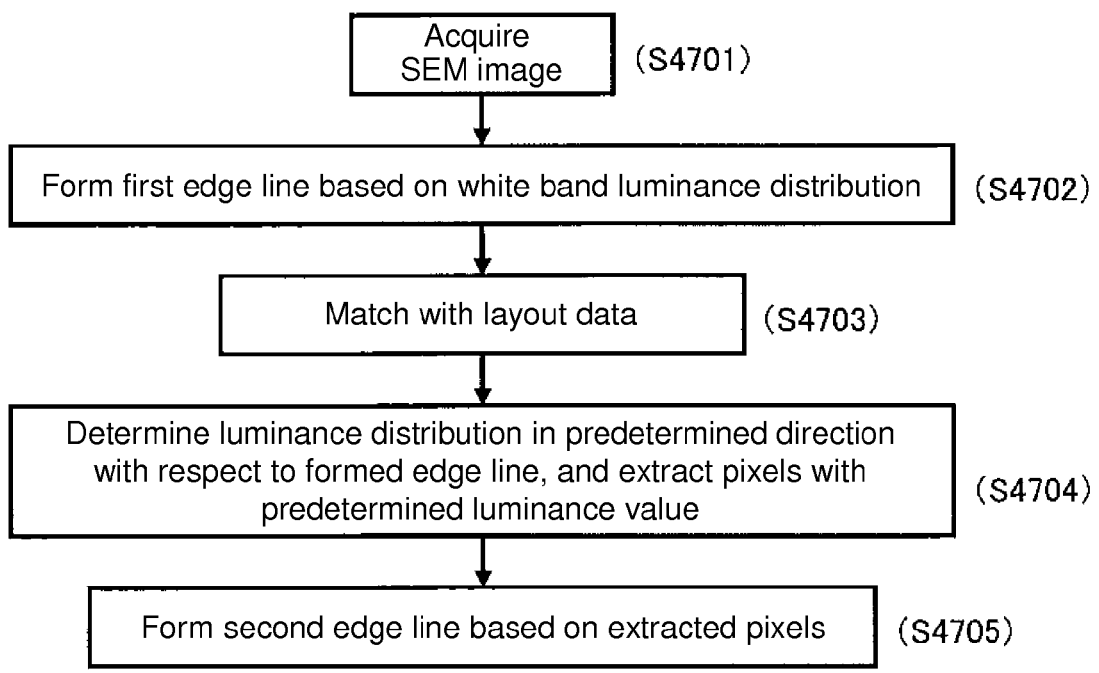
FIG. 47 is a flowchart of a process of extracting an edge line on the basis of an SEM image.

FIG. 46 illustrates an example of the method for extracting an edge line from a pattern image formed on the basis of detected electrons. This edge line extracting process may be performed by the computing apparatus in the data managing apparatus 4501, or by the control apparatuses 4504 and 4505 connected to the SEMs. For edge line extraction, as shown in the flowchart of FIG. 47 by way of example, first an SEM image is formed by the SEM 4502 or the SEM 4503 (step 4701). Then, a first edge line 4604 is extracted from a white band 4603 corresponding to an edge part of a pattern 4601 on the SEM image (step 4702). The method for extracting the first edge line 4603 may include extracting a pattern image composed of bitmap data from the SEM image and then converting the pattern image into pattern data composed of vector data.

Then, superposition of layout data 4602 and the formed first edge line 4604 is performed by vector data comparison or pattern matching of the first edge line 4604 and the layout data 4602 (step 4703). The layout data 4602 include line segment information of the design data stored in GDS format and the like. After this superposition, a luminance distribution information collecting area is set vertically to the first edge line 4604, and luminance distributions 4607 and 4608 are detected (step 4704). Pixels having a predetermined brightness are extracted from the luminance distributions thus formed, and the positions of the pixels are defined as second edge line positions, whereby a more accurate edge line can be formed (step 4705).

As a method for forming such an accurate edge line, the existing methods described in Japanese Unexamined Patent Publications No. 60-169977, No. 6-325176, No. 8-161508, No. 9-204529, for example, may be applied.

By superposing the first edge line and the layout data upon one another as described above, the layout data and the first edge line can be matched with each other on a line segment basis. By using the line segment information of each line segment that the layout data possess as the line segment information of each edge line, the edge line data can be registered in the same predetermined format as that for the design data.

Even when the line segments of a pattern are matched with each other as described above, an accurate position may not be identified. In the following, a method such that position identification can be accurately performed will be described. When the degree of deformation is large and matching with the layout data cannot be performed well, positioning between the first edge line and the design data may be performed by a positioning method described below.

Figure 2:
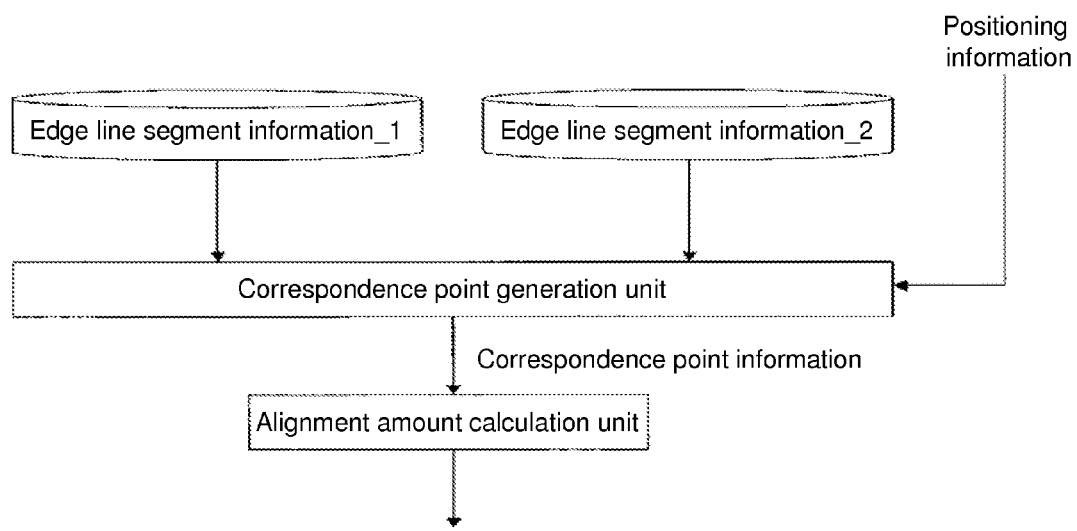
FIG. 2 illustrates an example of an image processing apparatus.

FIG. 2 illustrates an example of an image processing apparatus such as the data managing apparatus 4501. In the present embodiment, an edge line in an SEM image of a semiconductor pattern or design data is referred to as "edge line segment information". This is due to the fact that an edge line is generally expressed as continuous line segment information with connected vertexes. In practice, however, the edge line or design data may be expressed without vertexes, such as by a mathematical expression. What is important is that points are defined on an edge line at appropriate intervals, and such points will be referred to as "vertexes".

In the present embodiment, the two edge lines for positioning, such as the edge lines in the SEM image of a semiconductor pattern or the design data, are designated as "edge line segment information_1" and "edge line segment information_2". A correspondence point generation unit generates a pair of information of a point on the edge line segment information_1 and a point on the edge line segment information_2 for corresponding edge lines on the basis of positioning information input from the outside. One of the paired points is a vertex on the edge line segment information_1 or a vertex on the edge line segment information_2.

Figure 3:
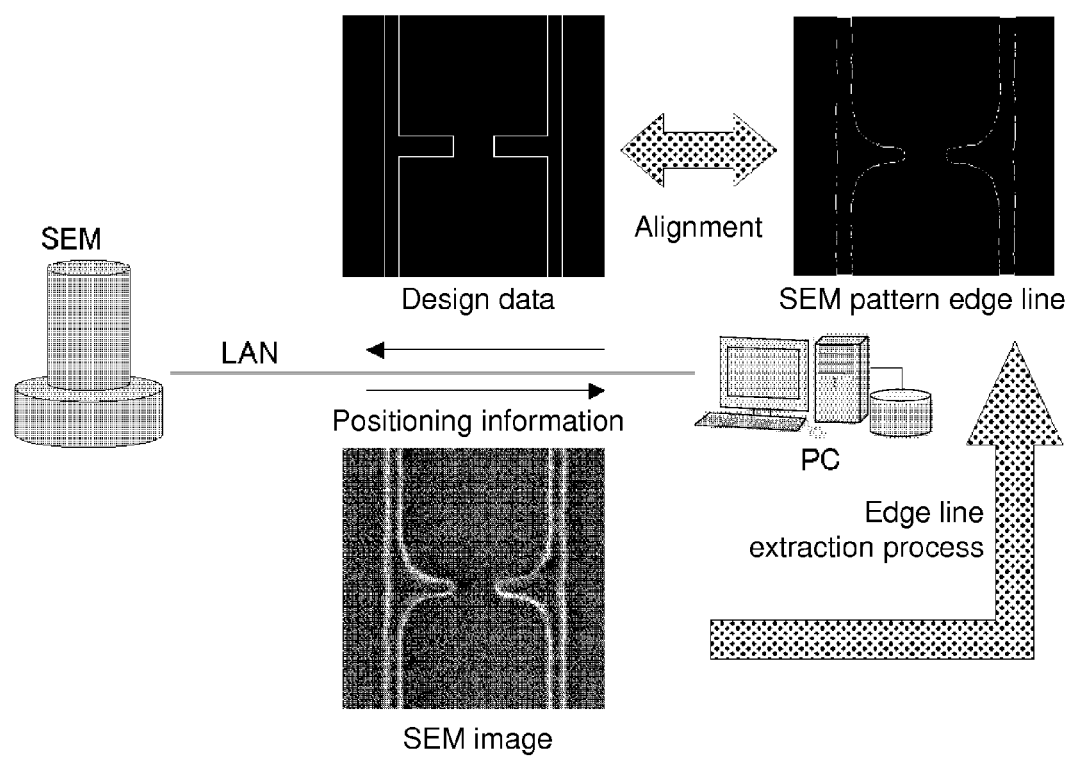
FIG. 3 schematically illustrates a semiconductor measurement or inspection system.

As the positioning information, rough positioning information obtained by a conventional pattern matching method may be used, or edge line information acquired at the edge line formation stage may be used. In the present embodiment, information required for highly accurate positioning is acquired on the basis of the rough positioning information. The information required for the highly accurate positioning will be referred to as a "degree of alignment", and a process for determining the degree of alignment will be referred to as "alignment". A degree of alignment computation unit calculates the degree of alignment on the basis of the correspondence point information. The degree of alignment may be determined such that the distances between correspondence points become uniformly short. Specifically, as will be described later, the degree of alignment may be determined such that the sum of squares or the weighted sum of squares of the distances between correspondence points is minimized, or such that the dispersion of distances between correspondence points is minimized FIG. 3 illustrates an outline of a semiconductor measurement or inspection system. In the example of FIG. 3, alignment is performed by an external PC. To the SEM, a recipe including information of design data is transferred from the external PC connected via a LAN. The SEM acquires an SEM image on the basis of the recipe, and performs positioning with the design data. To the external PC, the SEM image and positioning information are sent from the SEM. The external PC performs an edge line extraction process based on the SEM image, and performs alignment between the edge line and the design data. The resultant degree of alignment is used for various applications, such as for EPE measurement or OPC model calibration.

Figure 4:
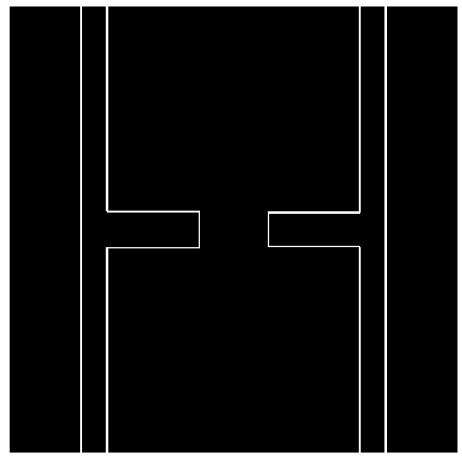
FIG. 4 illustrates examples of changes in correspondence points depending on the positional relationship between design data and edge line.
Figure 4:
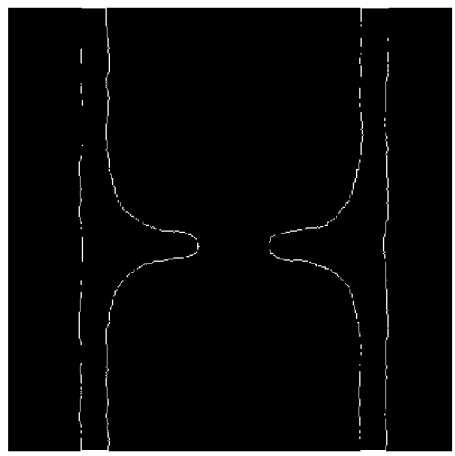
Figure 4:
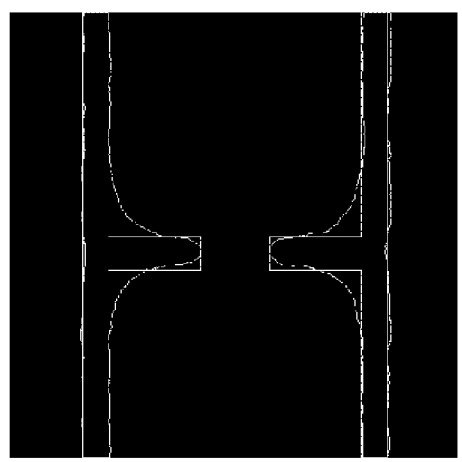
Figure 4:
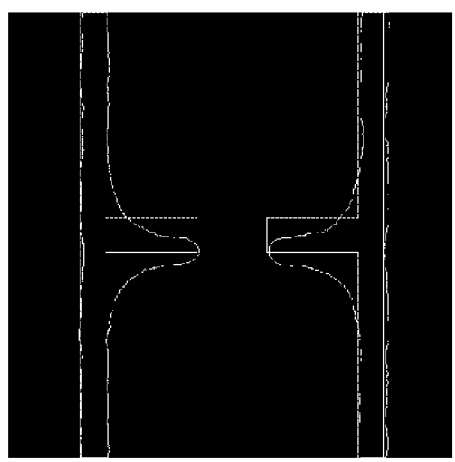
Figure 4:
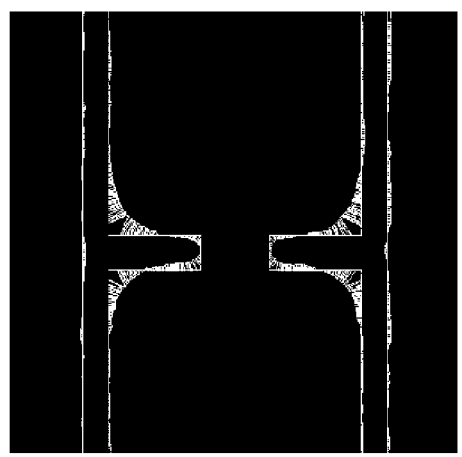
Figure 4:
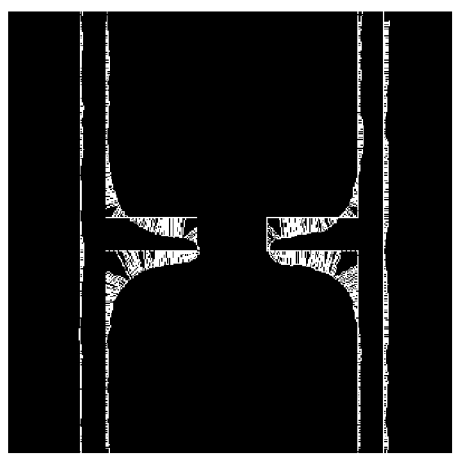

FIG. 4 illustrates examples in which the correspondence point information is changed depending on the relative positional relationship between design data and an edge line of an SEM pattern. FIG. 4(a) shows design data. FIG. 4(b) shows the edge line of the SEM pattern. FIGS. 4(c) and (d) show positional relationships based on different positioning information. FIG. 4(e) shows an example of correspondence point information generated on the basis of the positioning information of FIG. 4(c). FIG. 4(f) shows an example of correspondence point information generated on the basis of the positioning information of FIG. 4(d). Generally, the correspondence point information is dependent on the positioning information.

Figure 5:
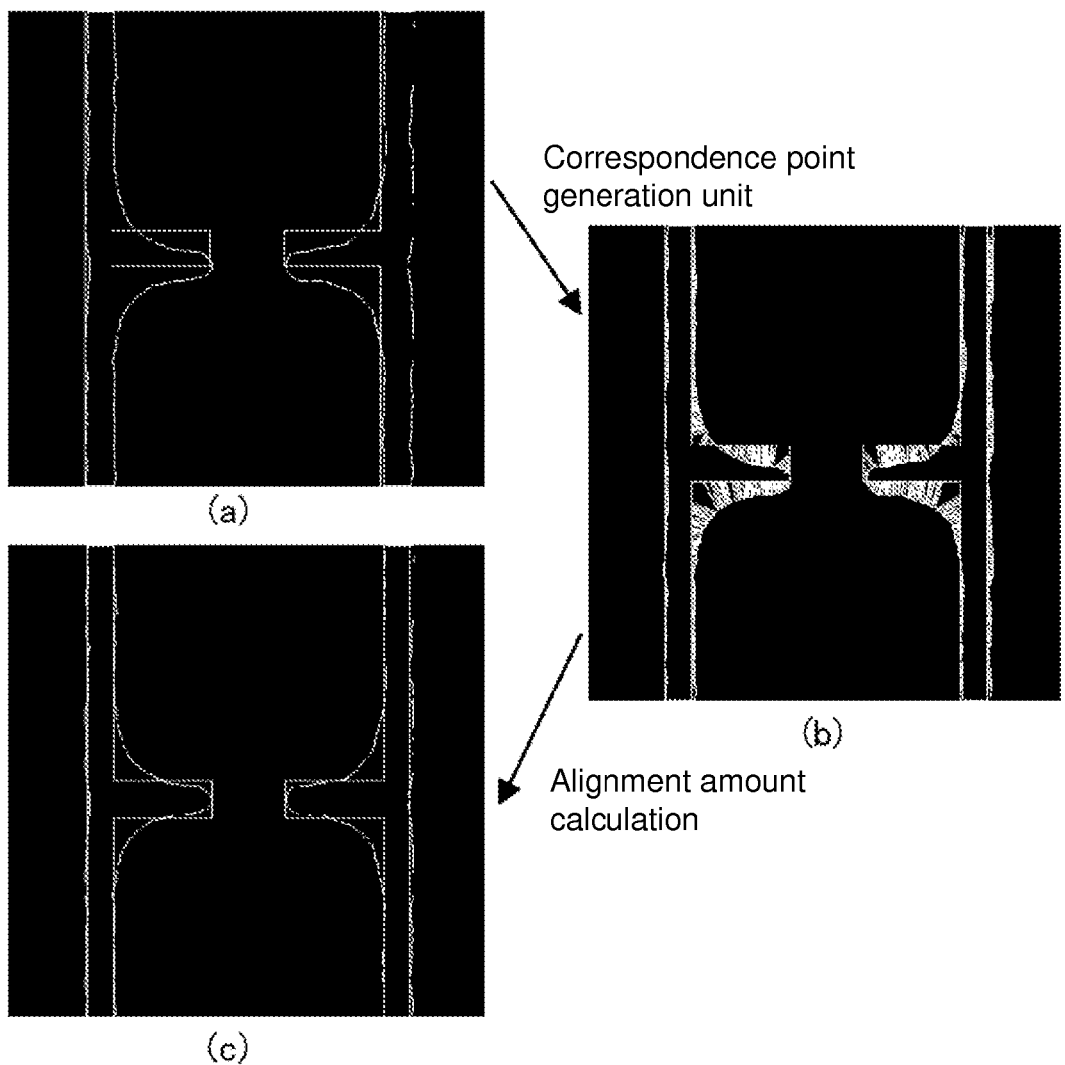
FIG. 5 illustrates an example of calculation of a degree of alignment on the basis of generation of correspondence points for two line segments.

FIG. 5 illustrates an example in which the degree of alignment is calculated on the basis of the generation of correspondence points. The correspondence point generation unit generates correspondence point information shown in FIG. 5 (b) for positioning shown in FIG. 5(a). The degree of alignment computation unit generates the degree of alignment from the correspondence point information. FIG. 5(c) shows the superposition of the design data and the edge line of an SEM pattern in accordance with new positioning obtained by correcting the position by the degree of alignment generated by the degree of alignment computation unit, with respect to the positioning shown in FIG. 5(a). A slight up-down position error in FIG. 5(a) is corrected in FIG. 5(c).

Figure 6:
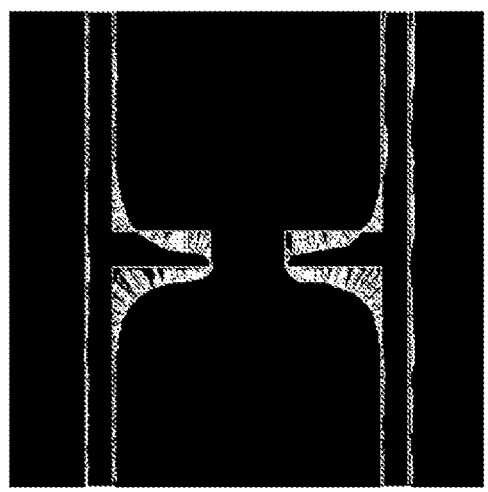
FIG. 6 illustrates an example of generation of correspondence points on the basis of flow lines of a vector field generated from an edge line, design data, and positioning information.
Figure 6:
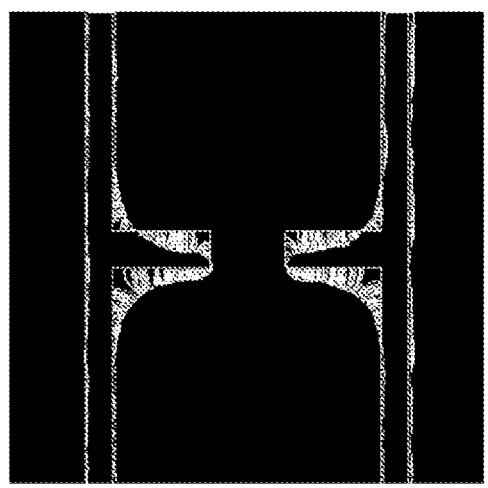

FIG. 6 illustrates examples in which correspondence points are generated on the basis of flow lines of a vector field generated from an edge line of the input SEM pattern, the design data, and the positioning information. FIG. 6(a) shows the example in which the vector field was generated by using only the edge line of the SEM pattern. FIG. 6(b) shows the example in which the vector field was generated by using both the edge line of the SEM pattern and the design data. The vector field in FIG. 6(a) is continuous at every point, while the vector field in FIG. 6(b) is continuous at points other than the points of intersection of the edge line of the SEM pattern and the design data. A vector field is a space in which vectors are defined for the positions of points. A flow line, which may also be referred to as a line of force, is a trajectory of a given vector field. Namely, at every point on a flow line, the flow line is tangent to the vector of the given vector field at the position of that point.

For example, a flow line of a vector field called "electric field" is an electrical line of force, and a flow line of a vector field called "magnetic field" is a magnetic line of force. By definition, flow lines never intersect each other. If flow lines were to intersect each other, two vectors would be defined at the point of intersection, which is against the definition of a vector field.

Figure 7:
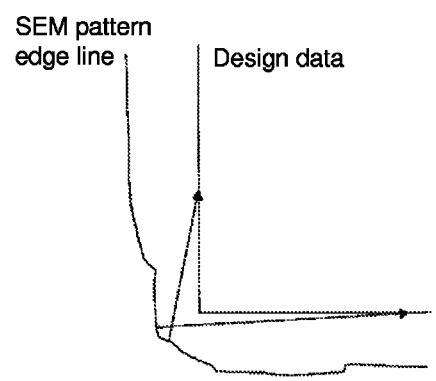
FIG. 7 illustrates an example of setting correspondence points for design data in orthogonal directions by using an edge line as the base point.

FIG. 7 illustrates an example of matching a vertex to its correspondence point, in which a correspondence point for a vertex of an edge line of an SEM pattern is determined in a direction orthogonal to the edge line of the SEM pattern.

In this example, the order of the vertex and the correspondence point is reversed. Such correspondence does not yield an appropriate degree of alignment. In contrast, in the correspondence point generation based on flow lines, the order is not reversed because the flow lines never intersect each other.

Figure 8:
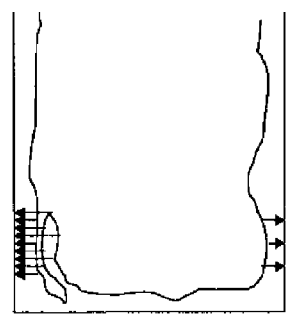
FIG. 8 illustrates an example of setting closest points on design data as correspondence points by using an edge line as the base point.

FIG. 8 illustrates an example in which the correspondence points are determined at points on the design data that are closest from the vertexes. Specifically, the vertexes of an edge line of the SEM pattern are matched with the design points with the shortest distance from the vertexes. Whether the matching is from the design data to the edge line of the SEM pattern or from the edge line of the SEM pattern to the design data is essentially not different. The situation is the same as the case in which the matching is from the design data to the edge line of the SEM pattern when the design is provided with OPC such that the design data have a more complex shape.

When the vertexes for matching are on a complex shape, multiple matches may be produced such that an appropriate degree of alignment may not be obtained. However, in the case of the correspondence point generation illustrated in FIG. 6(b) (for which a specific method will be described later), points with zero vectors are produced at such a complex portion in the vector field whereby flow lines are eliminated and no matching is made. Thus, an appropriate degree of alignment can be calculated.

The correspondence points obtained by matching along flow lines have the characteristics that the starting point and the end point for matching are still correspondence points even when reversed. Thus, when the intervals between end points for matching become coarse, points may be added between them, and matching may be made by using the added points as starting points so as to obtain correspondence points, and yet the order is not changed by the matching and consistent matching can be made.

Figure 9:
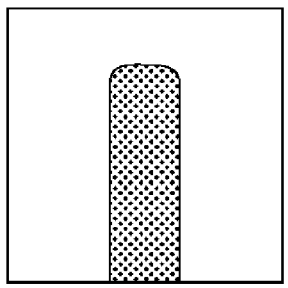
FIG. 9 illustrates examples of expressing edge line shapes as contour lines.
Figure 9:
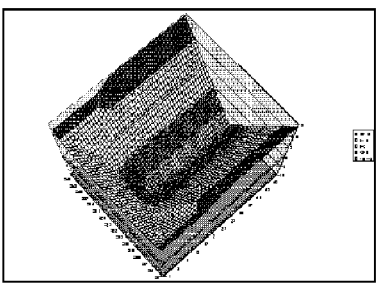
Figure 9:
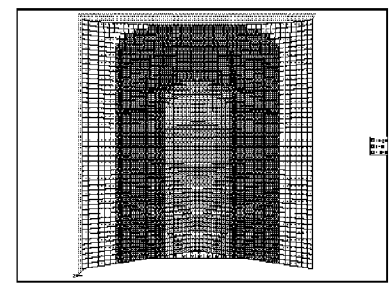
Figure 9:
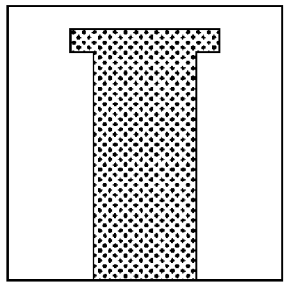
Figure 9:
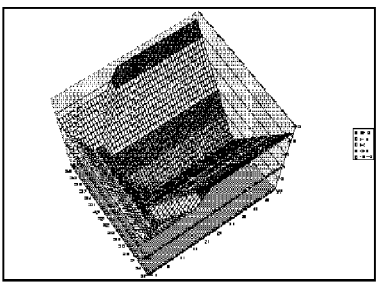
Figure 9:
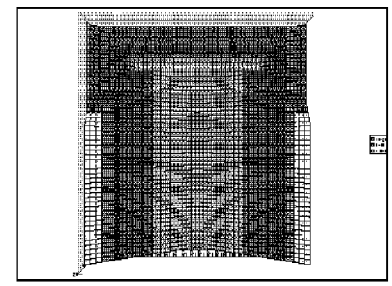

FIG. 9 illustrates that an edge line shape can be expressed as a 0-Level contour line of a signed distance transform image. The signed distance transform image refers to an image that has distances from an edge line (the distances have a negative sign for those inside the edge line and a positive sign for those outside the edge line) as pixel values. The signs may be reversed as long as the positive and negative signs and the inside and outside of the edge line correspond to each other. The signed distance transform images shown in FIG. 9 are graphs in which the pixel values are shown in the z-axis direction and represented three-dimensionally, as viewed diagonally so that the pixel values can be easily seen. When the graphs are seen as topographic information with the pixel values of the signed distance transform images showing height, the 0-Level contour lines are the sets of pixels with zero distance from the edge line and are therefore expansions of the edge lines themselves into an image. The 0-Level contour lines shown in FIG. 9 represent the three-dimensional graphs as viewed directly from above, with the line of change in color at the center indicating the edge line.

Figure 10:
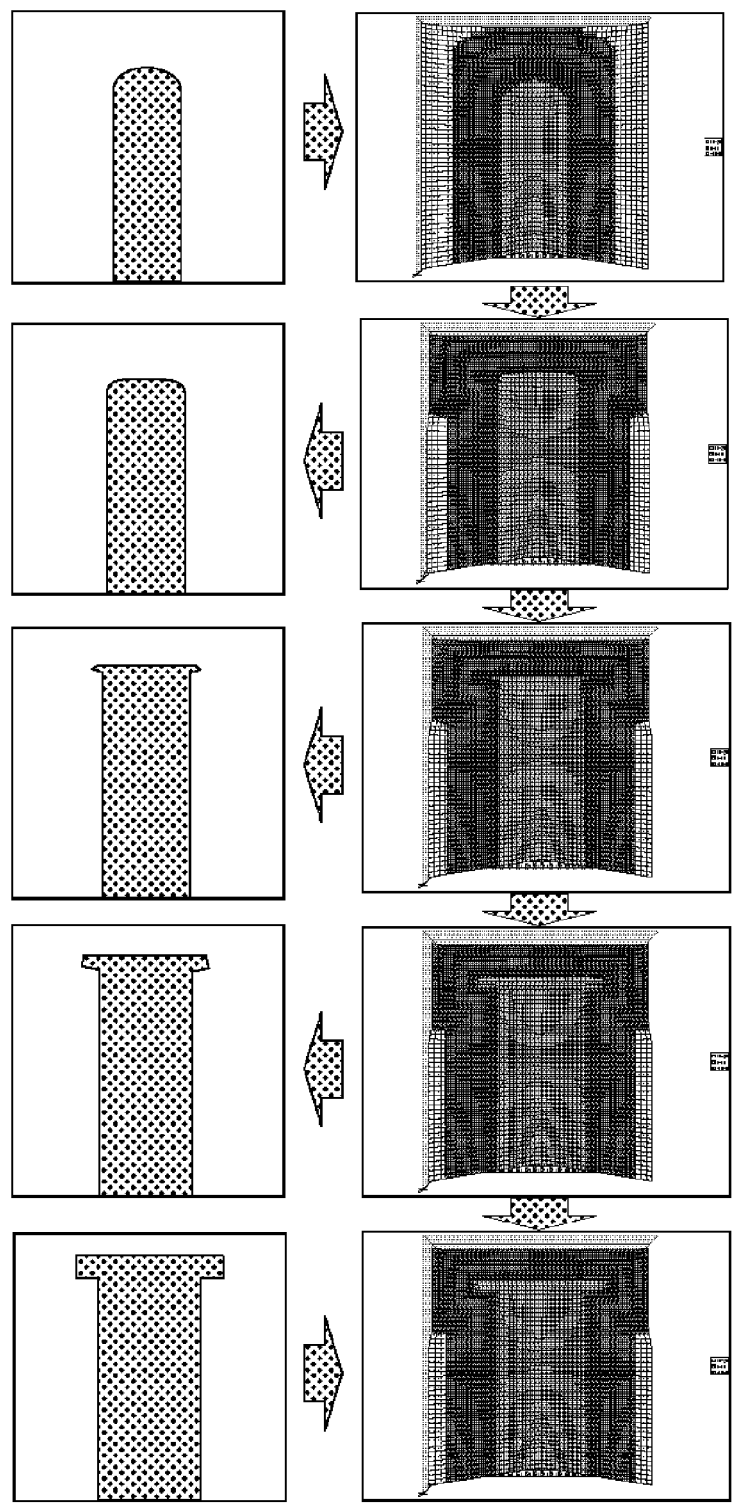
FIG. 10 illustrates an example in which signed distance transform images are generated for two edge lines and weighted mean data for each of the signed distance transform images are created.

FIG. 10 shows that when the signed distance transform images are generated for the two edge lines and a weighted mean (blend) of the signed distance transform images is created, the 0-Level contour line of the blended signed distance transform image has a shape that interpolates the initial two edge line shapes. The blend ratio (weight) of the edge line shape with the round top is increased toward the top of the figure, while the blend ratio of the edge line shape with the hammer-like shaped top is increased toward the bottom. In this way, interpolation or blending of two edge line shapes can be defined. An average shape for three of more edge line shapes can be similarly defined.

Figure 11:
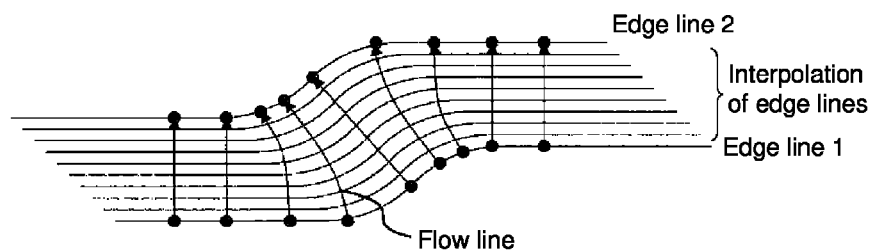
FIG. 11 illustrates an example in which a plurality of interpolation edge lines are formed between two edge lines.

FIG. 11 illustrates edge line interpolation between two edge lines (an edge line 1 and an edge line 2) and shows a plurality of interpolation edge lines between the edge line 1 and the edge line 2. When a curve vertically intersecting all of the interpolation edge lines is considered, the direction at each point on the curve corresponds to a gradient (hereafter referred to as a "grad") direction (steepest descent direction) of the weighted mean image of the signed distance transform images of the edge line 1 and the edge line 2 at that point, on the basis of which weighted mean image the interpolation edge line passing through that point has been generated as the 0-Level contour line. Namely, a vector field can be defined by associating the grad vector of the weighted mean image of the signed distance transform images of the edge line 1 and the edge line 2 at every point, on the basis of which weighted mean image the interpolation edge line passing through that point has been generated as the 0-Level contour line.

Further, the curve vertically intersecting all of the interpolation edge lines forms a flow line in the vector field. FIG. 11 illustrates how the generation of the correspondence points from the edge line 1 to the edge line 2 is performed on the basis of the flow lines.

The grad vector of the weighted mean image of the two signed distance transform images is equal to the weighted mean of the grad vectors of the respective signed distance transform images. This is because the x and y components of the grad vector are the differential values of the image in the x and y directions, and that the differential operation is linear and interchangeable with the weighted mean. It should be noted here that the weight of the weighted mean of the signed distance transform images and the weight of the weighted mean of the grad vector are equal.

Figure 12:
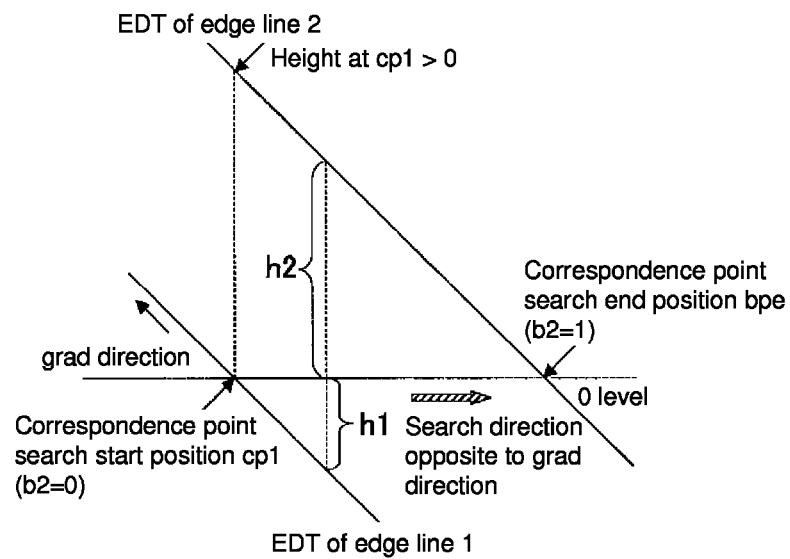
FIG. 12 illustrates an example of identifying correspondence points for two edge lines by using a signed transform image.
Figure 13:
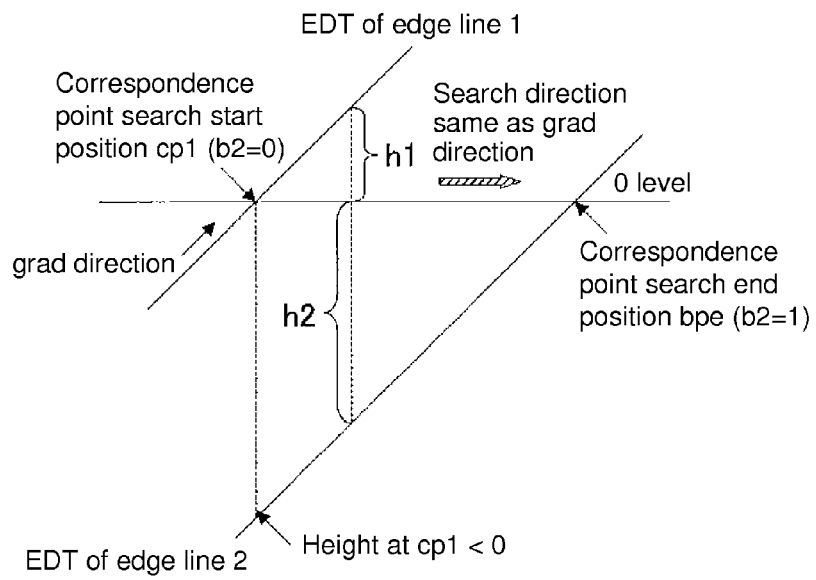
FIG. 13 illustrates an example of identifying correspondence points for two edge lines by using a signed transform image.

FIGS. 12 and 13 illustrate a method for determining a correspondence point by using the flow lines. The correspondence points on the edge line 1 and the edge line 2 are designated "cp1" and "cp2", respectively. The horizontal axis schematically shows an integration of the x and y axes of the signed distance transform images (designated "EDT" (Euclid distance transform)), while the vertical axis schematically show the pixel value. The process of starting from the cp1 to reach the cp2 is referred to as a "correspondence point search".

FIG. 12 shows the case where the pixel value of the EDT of the edge line 2 at the cp1 is positive. The correspondence point search is conducted along the flow line (the tangent vector of which is the grad). Thus, in the illustrated example, the search direction is opposite to the grad. The process involves a repetition of advancing in this direction by a certain minute distance L and determining the grad at the point reached. The grad at each point may be obtained by determining the grads of the EDT of the edge line 1 and the edge line 2 in advance, and then blending them with blend ratios b1 and b2 corresponding to that point. The blend ratios are equal to the blend ratios of the EDT of the edge line 1 and the edge line 2 such that the height (pixel value) of the blend image of the EDT of the edge line 1 and the edge line 2 at that point is zero. Thus, we have:

$$b1 = h2/(h1+h2)$$

$$b2 = h1/(h1+h2)$$

where h1 and h2 are the absolute values of the height of the EDT of the edge line 1 and the edge line 2 at this point.

When there is a correspondence point, b2 monotonically increases from 0 to 1, and the point at which b2 is 1 (precisely, the point at which b2 is at a maximum less than 1) is determined as a "bpe". The bpe only has the accuracy of the lattice point of the pixel, so that there is no guarantee that this point is on the edge line 2. Thus, the cp2 is determined by calculating the point of intersection of an extension of the flow line (such as a line connecting the point at which b2 has exceeded 1 for the first time and bpe) and the edge line 2.

FIG. 13 shows the case where the pixel value of the EDT of the edge line 2 at the cp1 is negative. This case is similar to the case of FIG. 12 with the exception that the search direction is opposite to the grad.

Figure 14:
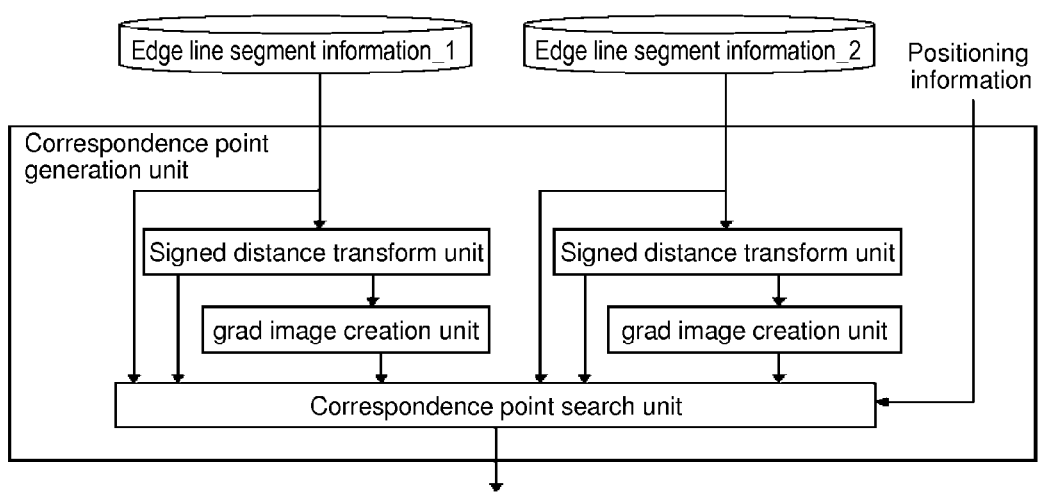
FIG. 14 illustrates an example of a correspondence point generation unit included in a positioning process unit.

FIG. 14 illustrates a configuration of the correspondence point generation unit for implementing the correspondence point generation method illustrated in FIGS. 11 to 13. The edge line segment information_1 and the edge line segment information_2 are input to the respective signed distance transform units where the respective signed distance transform images are generated. The signed distance transform images are further input to the grad image creation units where grad images (a pair of an x-direction differential image and a y-direction differential image) is generated.

The correspondence point search unit operates as described with reference to FIGS. 12 and 13. When the image generated on the edge line segment information_1 side and the image generated on the edge line segment information_2 side are referenced, a position offset of the referenced pixel is determined by using the positioning information.

Figure 15:
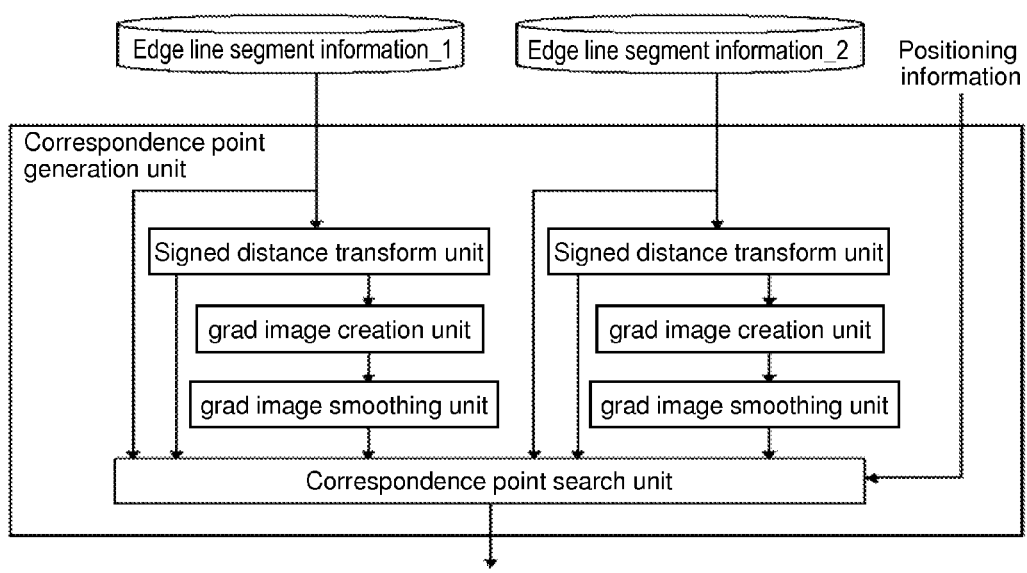
FIG. 15 illustrates an example of the correspondence point generation unit included in the positioning process unit.

FIG. 15 differs from FIG. 14 in that smoothing of the grad image is performed. This is a process of smoothing the x-direction differential image and the y-direction differential image. In this way, even when there is an angular part in the edge line, the vector field does not become discontinuous at that point and a flow line can be defined.

Figure 16:
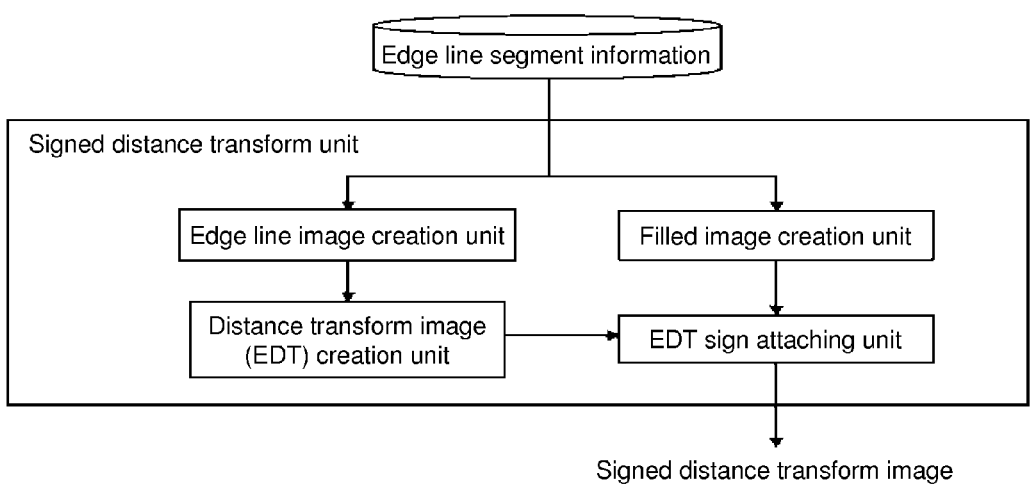
FIG. 16 illustrates an example of a signed distance transform unit included in the correspondence point generation unit.

FIG. 16 illustrates a configuration of the signed distance transform unit. The edge line segment information is input to an edge line image creation unit to create an edge line image. The edge line segment information is also input to a filled image creation unit to create a filled image. A distance transform image creation unit creates a distance transform image from the edge line image whose pixel values correspond to the distance from the edge line. An EDT sign attaching unit attaches signs to the pixel values of the distance transform image with reference to the filled image so as to generate the signed distance transform image. Specifically, the EDT sign attaching unit attaches a negative sign when the pixel value is within the edge line, or a positive sign when the pixel value is outside the edge line.

Figure 17:
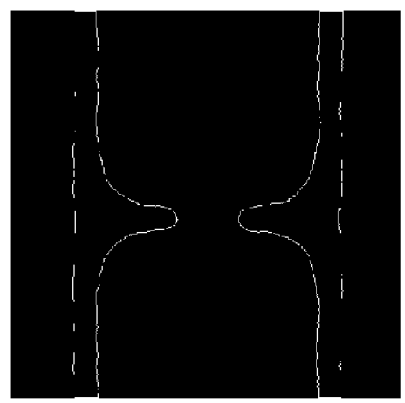
FIG. 17 illustrates examples of images formed in the signed distance transform unit.
Figure 17:
Figure 17:
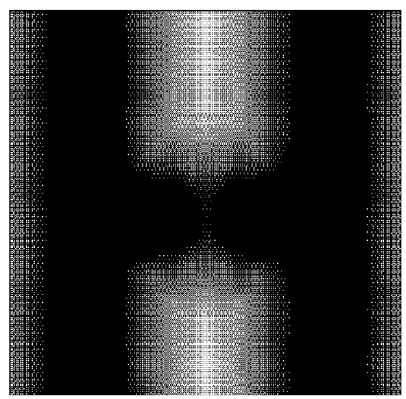
Figure 17:
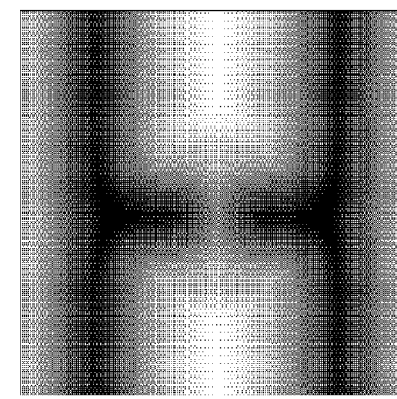
Figure 18:
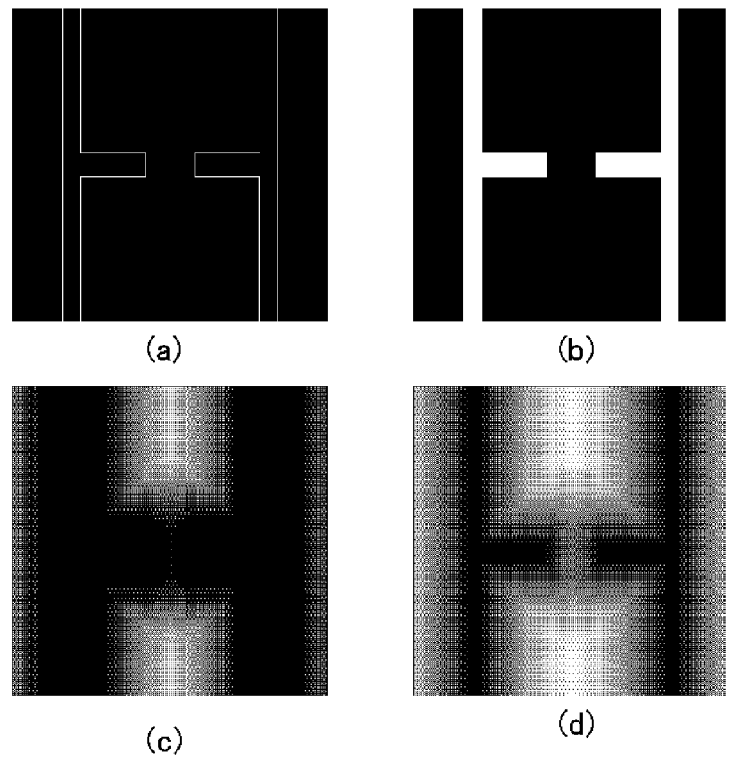
FIG. 18 illustrates examples of images formed in the signed distance transform unit.

FIG. 17 illustrates examples of the images generated by the various units of FIG. 16 with respect to the edge line of the SEM pattern. FIG. 17(*a*) shows the edge line image. FIG. 17(*b*) shows the filled image in which the inside of the edge line is painted in white. FIG. 17(*c*) shows the distance transform image generated from the edge line image of FIG. 17(*a*). FIG. 17(*d*) is the signed distance transform image obtained by attaching a negative sign to the portion of the distance transform image of FIG. 17(*c*) that is painted in white in the filled image of FIG. 17(*b*), and a positive sign to the portion that is not painted. FIG. 18 shows images similar to those of FIG. 17 for the design data.

Figure 19:
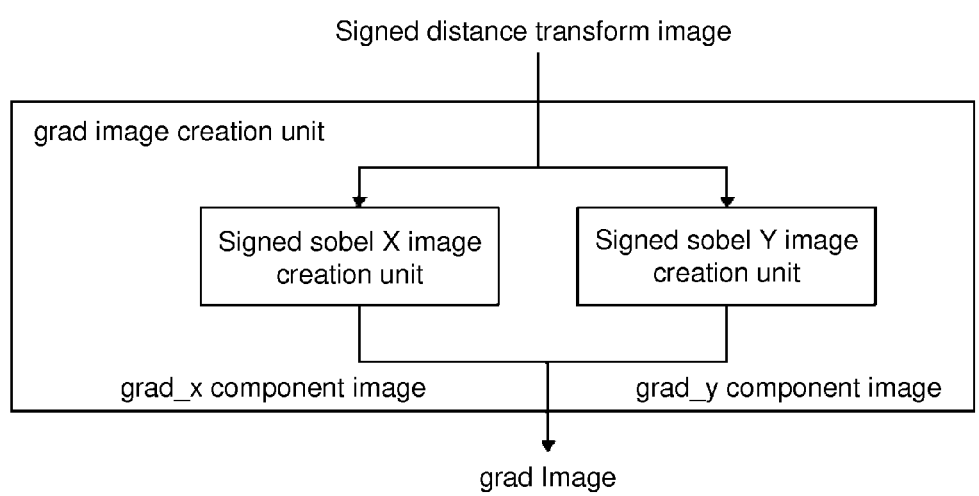
FIG. 19 illustrates an example of a grad image creation unit included in the correspondence point generation unit.

FIG. 19 illustrates a configuration of the grad image creation unit. The signed distance transform image is input to a signed Sobel X image generation unit so as to generate a grad_x component image (x-direction differential image). The signed distance transform image is also input to a signed Sobel Y image generation unit so as to generate a grad_y component image (y-direction differential image). These two images will be referred to as "grad images".

Figures 20, 21:
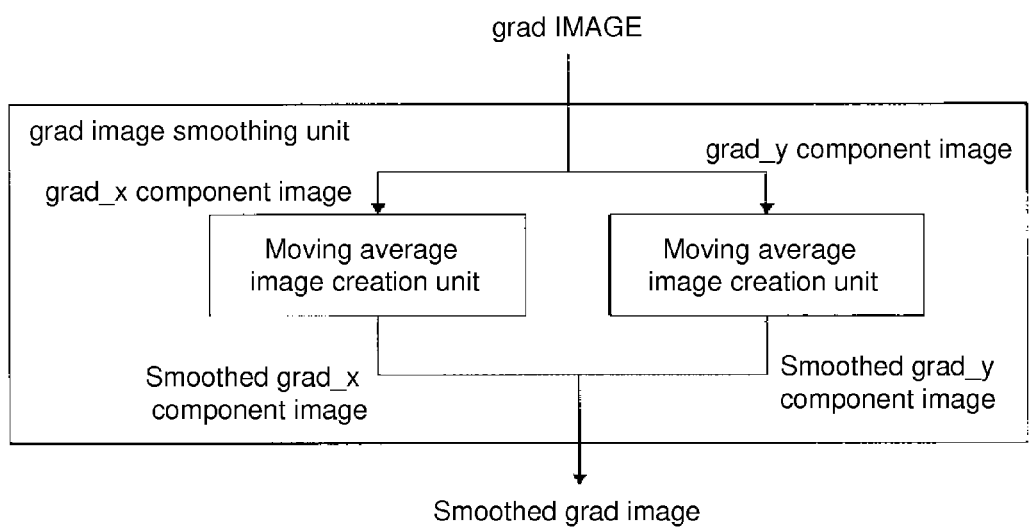
FIG. 20 illustrates kernel shapes for a filter process by a signed Sobel image generation unit.
FIG. 21 illustrates an example of a grad image smoothing unit included in the correspondence point generation unit.

FIG. 20 illustrates the kernel shapes for a filter process in the signed Sobel X image generation unit and the signed Sobel Y image generation unit. FIG. 20(*a*) shows the kernel shape of a Sobel X filter, while FIG. 20(*b*) shows the kernel shape of a Sobel Y filter. The Sobel X filter and the Sobel Y filter generate differential images.

FIG. 21 illustrates a configuration of the grad image smoothing unit. The input grad images (the grad_x component image and the grad_y component image) are input to respective moving average image creation units, which generate smoothed grad images (a smoothed grad_x component image and a smoothed grad_y component image). The moving average image creation units perform a process of subjecting the input image to a moving average filter.

Figure 22:
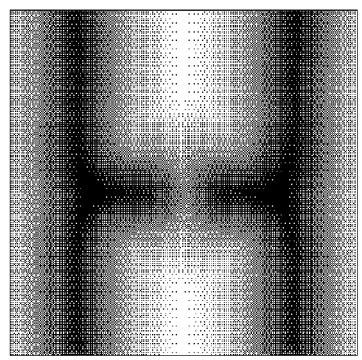
FIG. 22 illustrates grad images formed on the basis of a signed distance transform image.
Figure 22:
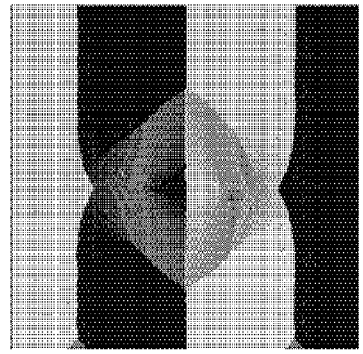
Figure 22:
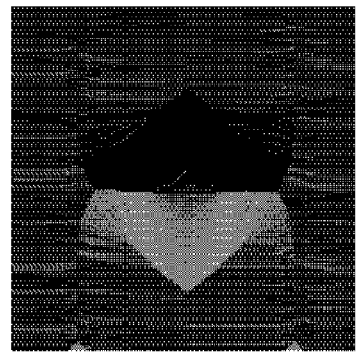
Figure 23:
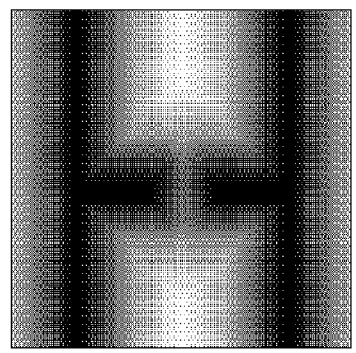
FIG. 23 illustrates grad images formed on the basis of a signed distance transform image.
Figure 23:
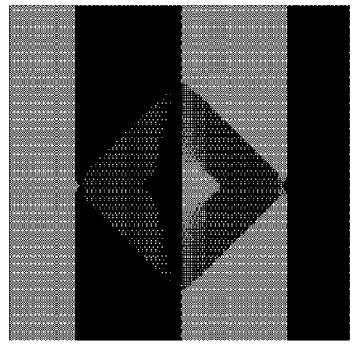
Figure 23:
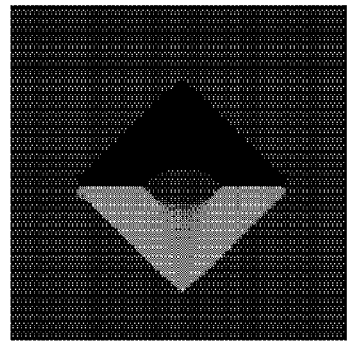
Figure 24:
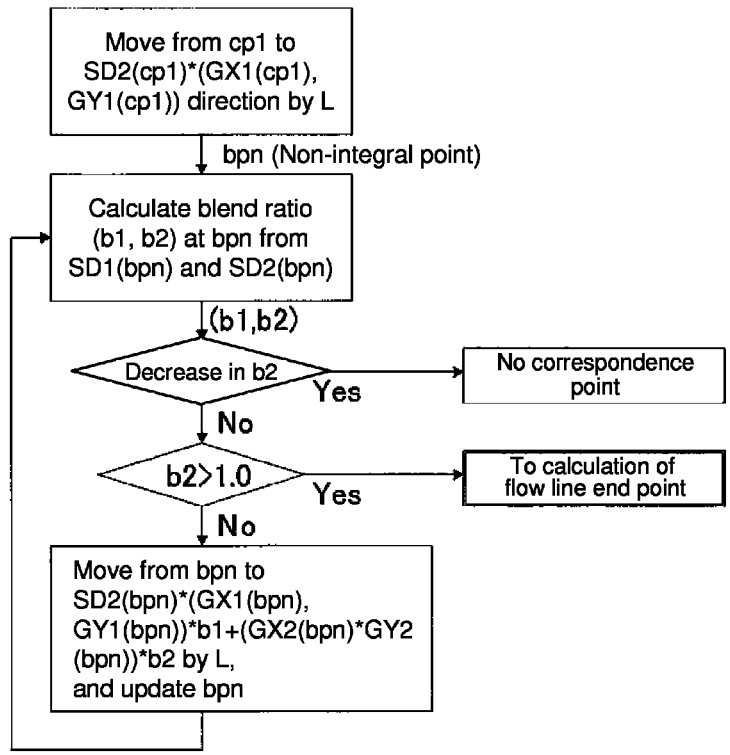
FIG. 24 is a flowchart of a process by a correspondence point search unit.

FIG. 22 shows the grad_x component image (b) and the grad_y component image (c) with respect to the signed distance transform image (a) of the edge line of the SEM pattern. FIG. 23 shows images similar to those of FIG. 22 for the design data. FIG. 24 is a flowchart of the operation of the correspondence point search unit, where:

C1: Edge line image of edge line segment 1
F1: Filled image of edge line segment 1
D1: Distance transform image of C1
SD1: Signed distance transform image of edge line segment 1
SX1: Signed Sobel X of SD1
SY1: Signed Sobel Y of SD1
GX1: Moving average of SX1
GY1: Moving average of SY1

The signs suffixed with the numeral "2" designate the series generated from the edge line segment 2.

A flow line end point calculation is the process of determining the point of intersection of the extension of the flow line and the edge line, as described with reference to FIG. 12.

Figure 25:
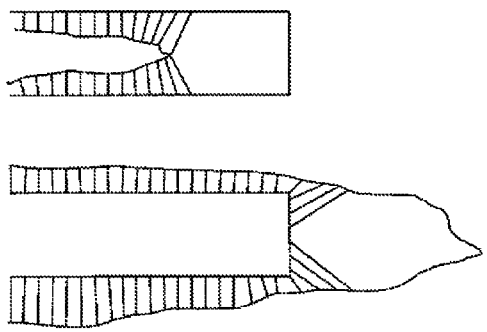
FIG. 25 illustrates examples of a correspondence search process performed between design data and an edge line.

FIG. 25 illustrates an example in which correspondence point generation is performed by the method illustrated with reference to FIGS. 11 to 24. FIG. 25(*a*) shows the case where, when the SEM pattern is shrunk and smaller than the design data, matching is found from the edge line of the SEM pattern toward the design data. FIG. 25(*b*) shows the case where, when the SEM pattern is formed larger than the design data, matching is found from the design data toward the edge line of the SEM pattern. In both cases, the matching to the end portion is coarse such that the information that can be used for lateral alignment is scarce.

Both when matching is made from the edge line of the SEM pattern toward the design data and when matching is made from the design data toward the edge line of the SEM pattern, the matching to the end portion may become coarse depending on the shape of the SEM pattern and the design data. This problem may be effectively overcome by performing matching both from the edge line of the SEM pattern toward the design data and from the design data toward the edge line of the SEM pattern, thereby complementing the matching. Particularly, by the method described with reference to FIGS. 11 to 24, a consistent correspondence relationship can be maintained even when the matchings in two directions are combined.

Figure 26:
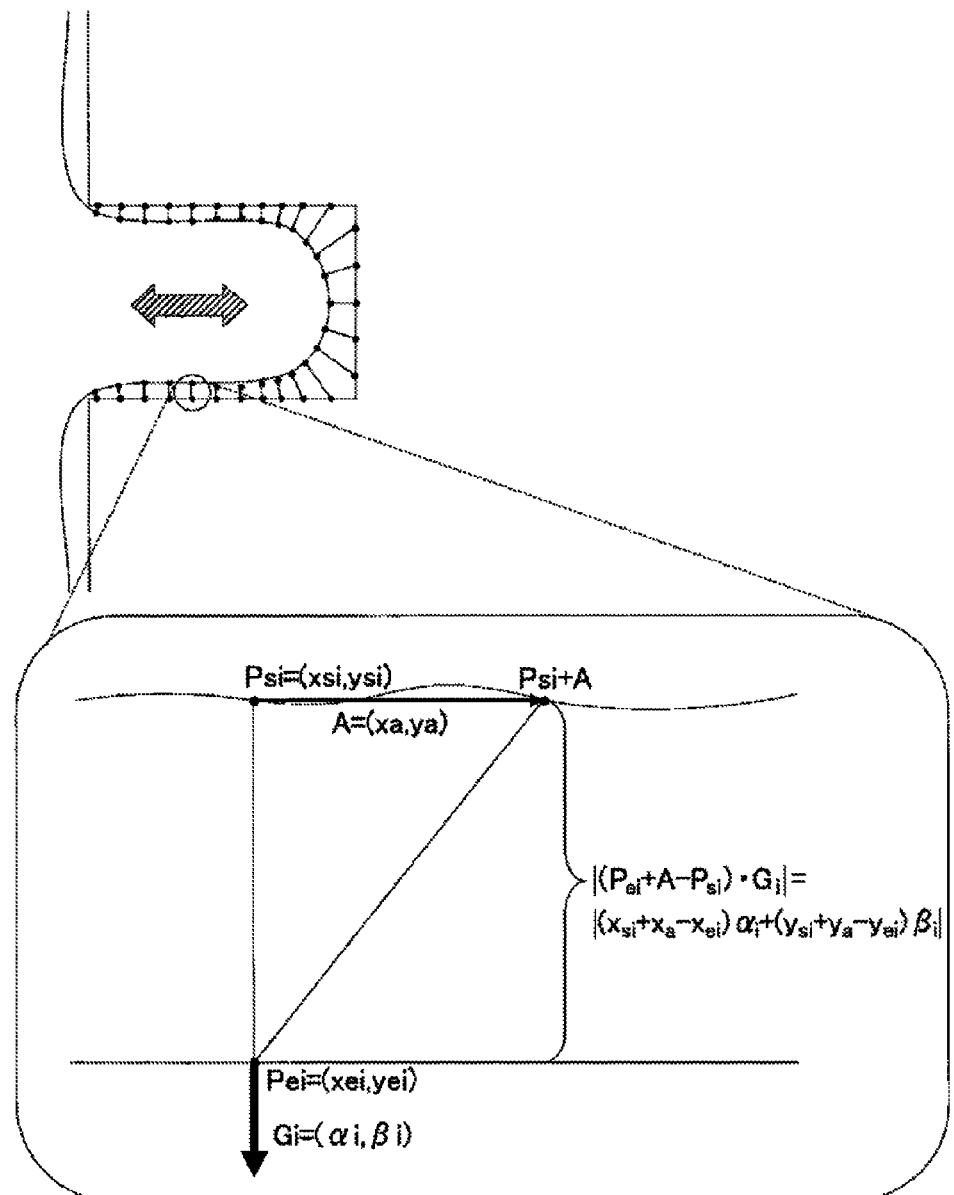
FIG. 26 illustrates an example of computation performed by a degree of alignment computation unit.

FIG. 26 illustrates an example of the calculation performed by the degree of alignment computation unit. When alignment is made such that the sum of squares of the distances between the correspondence points is minimized by using the matching prior to the alignment, movement in a direction parallel to the edge line is constrained. However, obviously the matching after alignment cannot be known before the alignment.

Because the matching before alignment is a provisional one, alignment should not be greatly dependent on the matching.

Thus, in order to prevent the alignment from being influenced by the matching too much, instead of minimizing the sum of squares of the distances between the correspondence points, alignment is performed such that the sum of squares of the lengths of projection of the distances between the correspondence points onto the grad vector direction at the correspondence points of the design data is minimized.

In this way, alignment can be performed such that the distances between the opposing edge lines can be equalized. When the i-th two corresponding points are $P_{si}=(x_{si}, y_{si})$ (for the edge line of the SEM pattern) and $P_{ei}=(x_{ei}, y_{ei})$ (for the design data), and the normalized grad vector at $P_{ei}$ is $G_i=(\alpha_i, \beta_i)$, the degree of alignment (shifting only) $A=(x_a, y_a)$ is determined such that the sum of squares of $(P_{ei}+A-P_{ei})\cdot G_i$ is minimized.

$$f(x_a, y_a) = \sum_i \{L_i((x_{si}+x_a-x_{ei}), (y_{si}+y_a-y_{ei}))\cdot(\alpha_i, \beta_i)\}^2 \quad \text{[Expression 1]}$$

$$\frac{\partial f(x_a, y_a)}{\partial x_a} = 2\sum_i L_i\alpha_i^2(x_{si}+x_a-x_{ei}) + 2\sum_i L_i\alpha_i\beta_i(y_{si}+y_a-y_{ei})$$
$$= 0$$

$$\frac{\partial f(x_a, y_a)}{\partial y_a} = 2\sum_i L_i\beta_i^2(y_{si}+y_a-y_{ei}) + 2\sum_i L_i\alpha_i\beta_i(x_{si}+x_a-x_{ei})$$
$$= 0$$

$$x_a = \frac{\left(\sum_i L_i\alpha_i\beta_i\right)\left(\sum_i L_i\beta_i P_i\right) - \left(\sum_i L_i\beta_i^2\right)\left(\sum_i L_i\alpha_i P_i\right)}{\left(\sum_i L_i\alpha_i^2\right)\left(\sum_i L_i\beta_i^2\right) - \left(\sum_i L_i\alpha_i\beta_i\right)^2}$$

$$y_a = \frac{-\left(\sum_i L_i\alpha_i^2\right)\left(\sum_i L_i\beta_i P_i\right) + \left(\sum_i L_i\alpha_i\beta_i\right)\left(\sum_i L_i\alpha_i P_i\right)}{\left(\sum_i L_i\alpha_i^2\right)\left(\sum_i L_i\beta_i^2\right) - \left(\sum_i L_i\alpha_i\beta_i\right)^2}$$

where $$P_i = (x_{si}-x_{ei})\alpha_i + (y_{si}-y_{ei})\beta_i$$

$L_i$ is the vertex interval at the I-th vertexes. By performing the calculation by weighting in accordance with the density of the vertexes, alignment can be performed without being influenced by the density of the vertexes.

For rotation:

$$f(\theta) = \sum_i L_i \quad \text{[Expression 2]}$$
$$|((x_{si}\cos\theta - y_{si}\sin\theta - x_{ei}), (x_{si}\sin\theta + y_{si}\cos\theta - y_{ei}))|^2$$

$$\frac{\partial f(\theta)}{\partial \theta} = 2\sum_i L_i(-x_{si}\sin\theta - y_{si}\cos\theta)(x_{si}\cos\theta - y_{si}\sin\theta - x_{ei}) +$$
$$2\sum_i L_i(x_{si}\cos\theta - y_{si}\sin\theta)(x_{si}\sin\theta + y_{si}\cos\theta - y_{ei})$$
$$= 0$$

$$\tan\theta = \frac{-\sum_i L_i(x_{ei}y_{si} - y_{ei}x_{si})}{\sum_i L_i(x_{ei}x_{si} + y_{ei}y_{si})}$$

where $\theta$ can be determined by arctan.

For rotation, too, instead of minimizing the sum of squares of the distances between the correspondence points, the lengths of projection of the distances between the correspondence points onto the grad vector direction at the correspondence points of the design data may be used. In this case, however, the computation may become somewhat complex.

Trying to determine both the shift component and the rotation component of the degree of alignment at the same time may complicate the calculation formula and make computation difficult.

Figure 27:
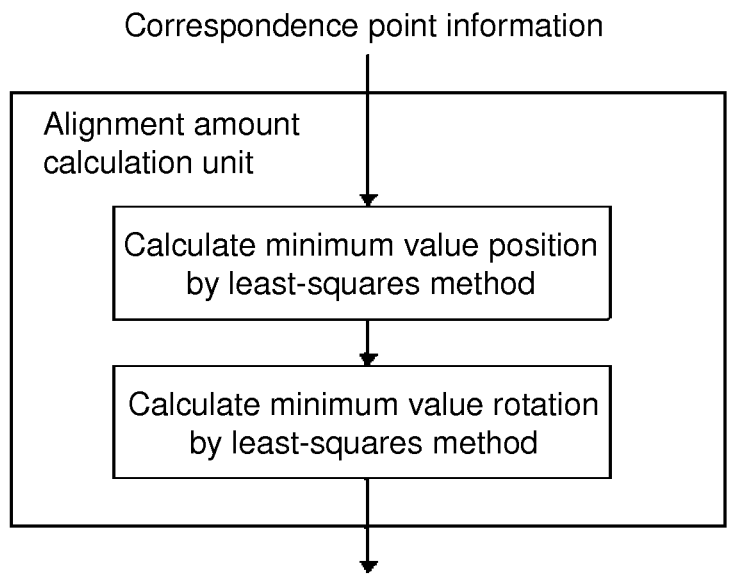
FIG. 27 illustrates an example of the degree of alignment computation unit for determining both a shift component and a rotation component of the degree of alignment.

FIG. 27 illustrates an example of a configuration of the degree of alignment computation unit for determining both the shift component and the rotation component of the degree of alignment. As described above, determining the shift component and the rotation component at once is difficult, thus in the illustrated example the shift amount is determined first, and then the rotation amount is determined.

Figure 28:
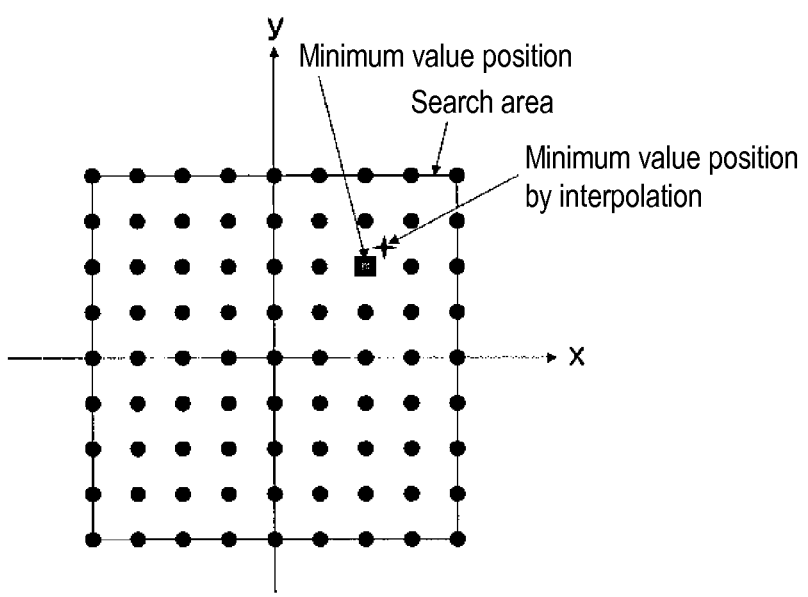
FIG. 28 illustrates an example of a process by the degree of alignment computation unit.

FIG. 28 illustrates that a point at which the shift object function f(x, y) is minimized is determined by a discrete search in the space of the x and y shift amounts, instead of by the least-square method, where, if higher accuracy is required, a point other than the search point at which the value of the object function is smaller may be calculated by interpolation from the values of the object function at the surrounding discrete points. When the minimizing object function is the sum of squares, the solution can be found by the least-square method as described above. Thus, the object function in the case of using the search may be effectively used when, for example, it is difficult to determine the minimum point of the dispersion of the distances between correspondence points by calculation, for example.

However, when the search area is large, computation time may be increased.

Figure 29:
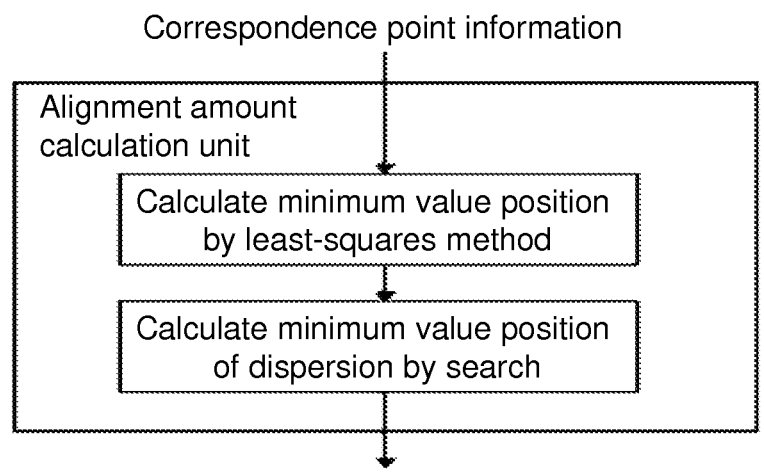
FIG. 29 illustrates another configuration of the degree of alignment computation unit.

FIG. 29 illustrates a configuration of the alignment computation unit according to another embodiment. First, the minimum point is determined by the least-square method, and then the surrounding area is searched for a point where the dispersion is minimized. In this way, the search area can be decreased. Further, there is the advantage that, while a bias is produced by the least-square method when the pattern shape is asymmetrical or the density of the correspondence point is biased, such bias is not easily produced by the minimization of the dispersion because the dispersion is minimized at a later stage.

Figure 30:
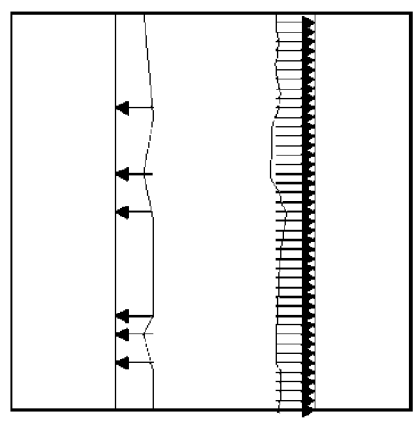
FIG. 30 illustrates an example in which there is a difference in the number of correspondence points for each portion of a pattern.

FIG. 30 illustrates an example in which the density of the correspondence points is biased. In such a case, it is preferable to minimize the dispersion as described above, or to perform the least-square method while weighting the vertex intervals.

Figure 31:
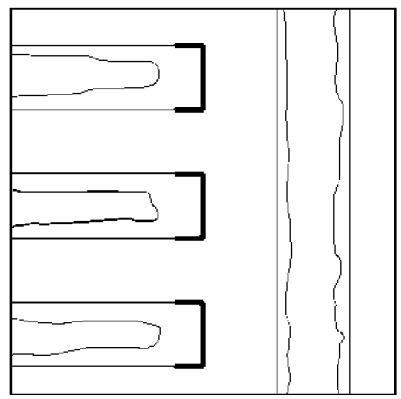
FIG. 31 illustrates an example of a pattern in which a vertical line and a horizontal line end are combined.

FIG. 31 illustrates a pattern in which a vertical line and a horizontal line end are combined. In such a case, the line end tends to be shrunk and receded. Thus, it is desirable to perform alignment for lateral positions by focusing evaluation on the vertical line pattern. For this purpose, it is effective to lower the weight for a portion with lower reliability as information to be used for alignment, such as the line end portion.

Figure 32:
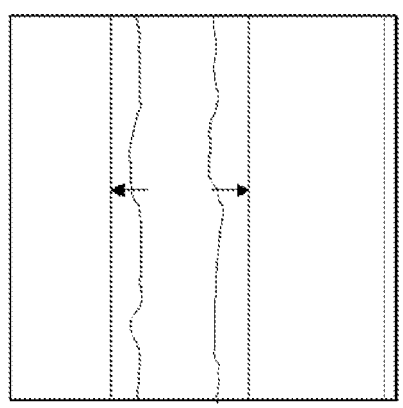
FIG. 32 illustrates an example in which a pattern edge exists at the end of an SEM image.
Figure 32:
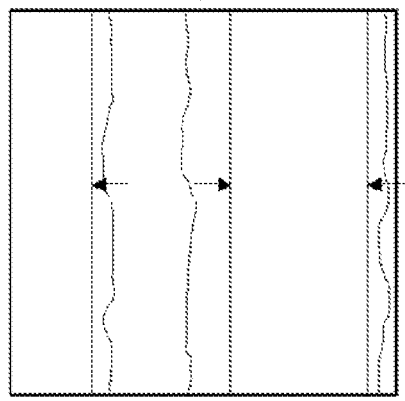
Figure 33:
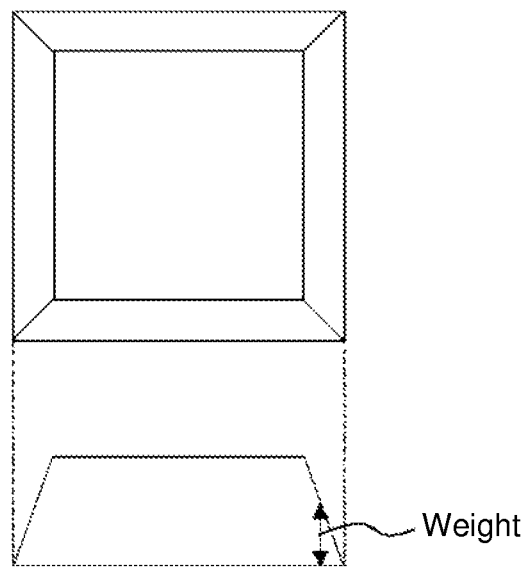
FIG. 33 illustrates an example in which the weighting outside the field of view of an SEM image is set lower.

FIG. 32 illustrates the case where a pattern exists at the edge that may or may not enter the field of view of the SEM image. At the position of the field of view of FIG. 32(a), the pattern is not in the field of view. At the position of FIG. 32(b), the field of view is shifted such that the pattern is visible within the field of view. In such a case, the symmetry of the pattern that has become visible due to the slight shift in the field of view may be lost such that the alignment result may be changed. In order to decrease the influence of such slight shift in the field of view on alignment, it is effective to set the weighting at the periphery of the field of view such that the weight is decreased outward, as shown in FIG. 33.

Figure 34:
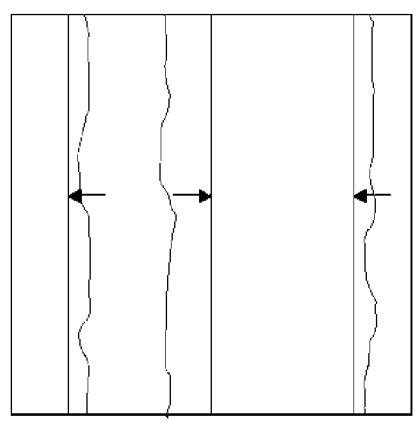
FIG. 34 illustrates an example in which two patterns with different sizes are included in an SEM image.

FIG. 34 shows the case where the pattern is asymmetrical. There are two leftward edge lines and one rightward edge line.

Figure 35:
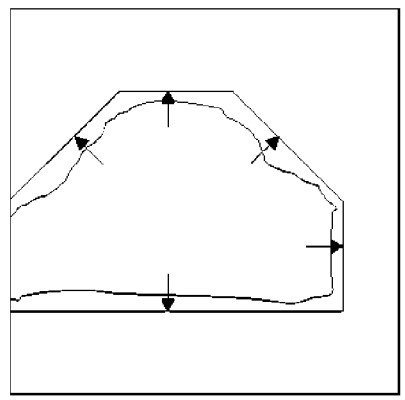
FIG. 35 illustrates an example in which the weight for each direction of a two-dimensional pattern included in an SEM image is expressed by a vector.
Figure 36:
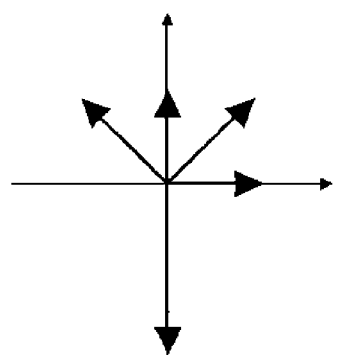
FIG. 36 illustrates an example in which the weight corresponding to each direction of a pattern is expressed by a vector.

In such a case, the least-square method may be performed by attaching twice as much weight to the rightward edge line. However, in a general two-dimensional pattern as shown in FIG. 35, it is not easy to calculate the weight. In FIG. 36, with respect to the two-dimensional directions of the pattern, the weights for the corresponding directions are expressed by the lengths in vector representation. The weight is the sum of the weights that the edge lines have in the corresponding direction. While in the present example, the sum of the weights is proportional to the length, the weight may be the product of all of the weights described with reference to FIGS. 31 and 33.

It may be desired to obtain a good alignment result by balancing these five directions by further multiplying them with the weight for each direction. This may be formulated by a mathematical expression such that the weighted sum of (1, 0), (1, 1), (0, 1), (−1, 1), and (0, −3) is zero vector, which is to find the weight such that:

$$W_0(1,0)+W_1(1,0)+W_2(1,0)+W_3(1,0)+W_4(1,0)=(0,0)$$

$$\vec{x} = \begin{bmatrix} 1 \\ 1 \\ 0 \\ -1 \\ 0 \end{bmatrix}, \vec{y} = \begin{bmatrix} 0 \\ 1 \\ 1 \\ 1 \\ -3 \end{bmatrix}, \vec{u} = \begin{bmatrix} W_0 \\ W_1 \\ W_2 \\ W_3 \\ W_4 \end{bmatrix} \quad [\text{Expression 3}]$$

When put as above, $$(\vec{x} \cdot \vec{u}) = 0 \quad [\text{Expression 4}]$$

$$(\vec{y} \cdot \vec{u}) = 0$$

$\vec{u}$ orthogonal to both $\vec{x}$ and $\vec{y}$ is determined by the Gram-Schmidt orthogonalization method.

$$\vec{u}_0 = \vec{x} \quad [\text{Expression 5}]$$

$$\vec{v}_0 = \frac{\vec{u}_0}{\|\vec{u}_0\|} = \frac{1}{\sqrt{3}} \begin{bmatrix} 1 \\ 1 \\ 0 \\ -1 \\ 0 \end{bmatrix}$$

$$\vec{u}_1 = \vec{y} - (\vec{y} \cdot \vec{v}_0)\vec{v}_0 \quad [\text{Expression 6}]$$

$$= \begin{bmatrix} 0 \\ 1 \\ 1 \\ 1 \\ -3 \end{bmatrix} - \left( \begin{bmatrix} 0 \\ 1 \\ 1 \\ 1 \\ -3 \end{bmatrix} \cdot \frac{1}{\sqrt{3}} \begin{bmatrix} 1 \\ 1 \\ 0 \\ -1 \\ 0 \end{bmatrix} \right) \frac{1}{\sqrt{3}} \begin{bmatrix} 1 \\ 1 \\ 0 \\ -1 \\ 0 \end{bmatrix}$$

$$= \begin{bmatrix} 0 \\ 1 \\ 1 \\ 1 \\ -3 \end{bmatrix}$$

$$\vec{v}_1 = \frac{\vec{u}_1}{\|\vec{u}_1\|} = \frac{1}{2\sqrt{3}} \begin{bmatrix} 0 \\ 1 \\ 1 \\ 1 \\ -3 \end{bmatrix}$$

$$\vec{u} = \vec{1} - (\vec{1} \cdot \vec{v}_0)\vec{v}_0 - (\vec{1} \cdot \vec{v}_1)\vec{v}_1 \quad [\text{Expression 7}]$$

$$= \begin{bmatrix} 1 \\ 1 \\ 1 \\ 1 \\ 1 \end{bmatrix} - \left( \begin{bmatrix} 1 \\ 1 \\ 1 \\ 1 \\ 1 \end{bmatrix} \cdot \frac{1}{\sqrt{3}} \begin{bmatrix} 1 \\ 1 \\ 0 \\ -1 \\ 0 \end{bmatrix} \right) \frac{1}{\sqrt{3}} \begin{bmatrix} 1 \\ 1 \\ 0 \\ -1 \\ 0 \end{bmatrix} - \left( \begin{bmatrix} 1 \\ 1 \\ 1 \\ 1 \\ 1 \end{bmatrix} \cdot \frac{1}{2\sqrt{3}} \begin{bmatrix} 0 \\ 1 \\ 1 \\ 1 \\ -3 \end{bmatrix} \right) \frac{1}{2\sqrt{3}} \begin{bmatrix} 0 \\ 1 \\ 1 \\ 1 \\ -3 \end{bmatrix}$$

$$= \begin{bmatrix} 2/3 \\ 2/3 \\ 1 \\ 4/3 \\ 1 \end{bmatrix}$$

Orthogonal projection of $\vec{1}$ onto the solution space is the solution $\vec{u}$ which is closest (with a small angle) to $\vec{1}$. Thus, $\vec{u}$ is the most equally balanced weight.

In this way, a balanced weight can be calculated.

Figure 37:
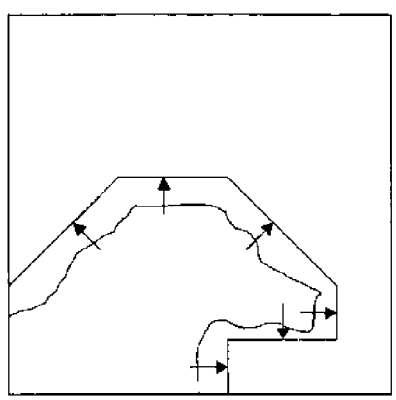
FIG. 37 illustrates an example in which the weight for each direction of a two-dimensional pattern included in an SEM image is expressed by a vector.
Figure 38:
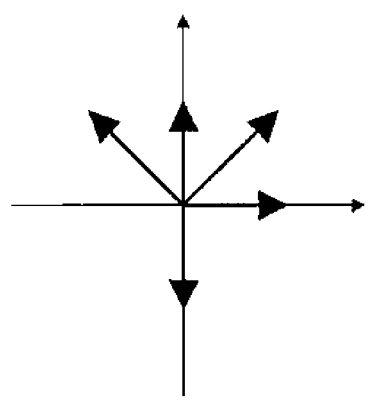
FIG. 38 illustrates an example in which the weight corresponding to each direction of a pattern is expressed by a vector.

FIG. 37 shows an example in which the pattern is the same as that of FIG. 35 in direction but differs in weight. When expressed in vectors, the pattern appears as shown in FIG. 38. The weight in this case can also be calculated as described above by the Gram-Schmidt orthogonalization method as follows.

$$\vec{u} = \vec{1} - (\vec{1} \cdot \vec{v}_0)\vec{v}_0 - (\vec{1} \cdot \vec{v}_1)\vec{v}_1 \qquad \text{[Expression 8]}$$

$$= \begin{bmatrix} 2/3 \\ 1/6 \\ 1/2 \\ 5/6 \\ 3/2 \end{bmatrix}$$

While the weight for (1, 1) is very small, it is not desirable to set the weight for a specific direction to be extremely large or small. It is effective to set a weight range, such as from ¼ to 4, and compulsorily bring any deviant value back within the range. Any intrinsically negative weight should also be made into a positive weight.

Figure 39:
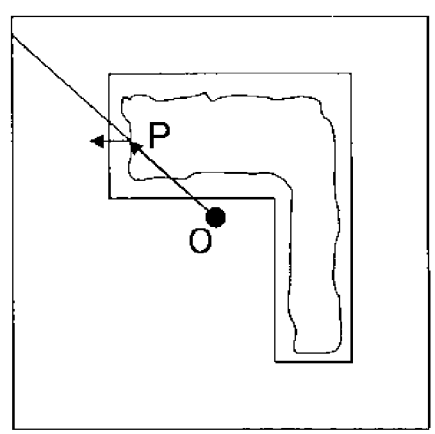
FIG. 39 illustrates an example of determining the weight of a rotation component of a two-dimensional pattern included in an SEM image.

While FIGS. 35 and 37 are concerned with the weight for calculating the shift component of the degree of alignment, FIG. 39 illustrates a method for determining the weight for determining the rotation component. A moment such that the center of rotation is the starting point and a vertex is the point of application of force is considered, and the moment with the force corresponding to the weight of the vertex in each of two directions for right rotation and left rotation is integrated. The weight that is balanced in the two directions is calculated (which is straightforward since the number of the directions is two).

Figure 40:
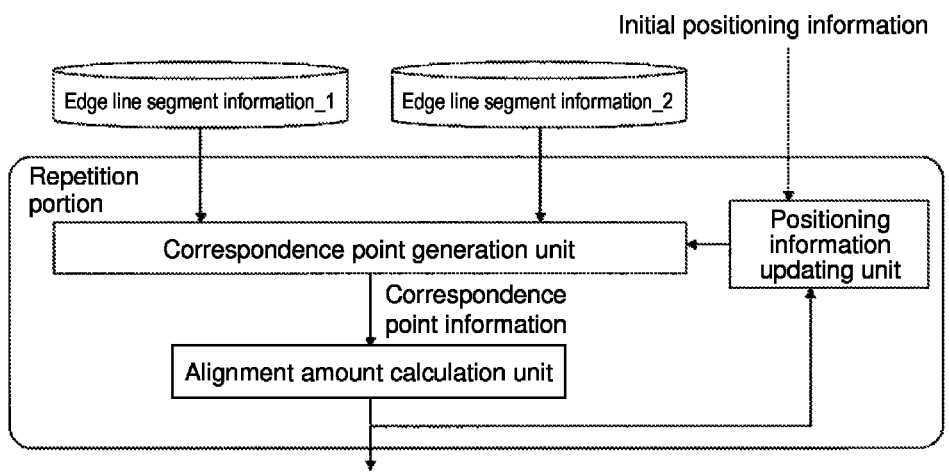
FIG. 40 illustrates an example of the image processing apparatus.
Figure 41:
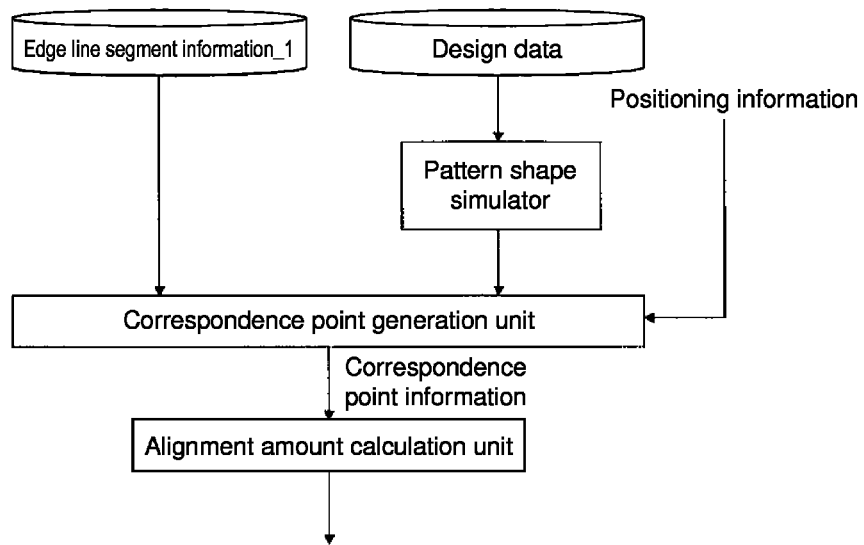
FIG. 41 illustrates an example of the image processing apparatus.

FIG. 40 shows a configuration such that, in contrast to the configuration of FIG. 2 in which the process of the correspondence point generation unit and the process of the alignment computation unit are each performed once, the process of the correspondence point generation unit and the process of the alignment computation unit can be repeated a plurality of times. For example, the degree of alignment that is determined for the first time is combined with the initial positioning information by the positioning information updating unit and then the process of the correspondence point generation unit is performed for the second time.

This configuration may be effective when the degree of alignment is so large that the initial matching may greatly differ from the matching after correct positioning is performed.

Figure 42:
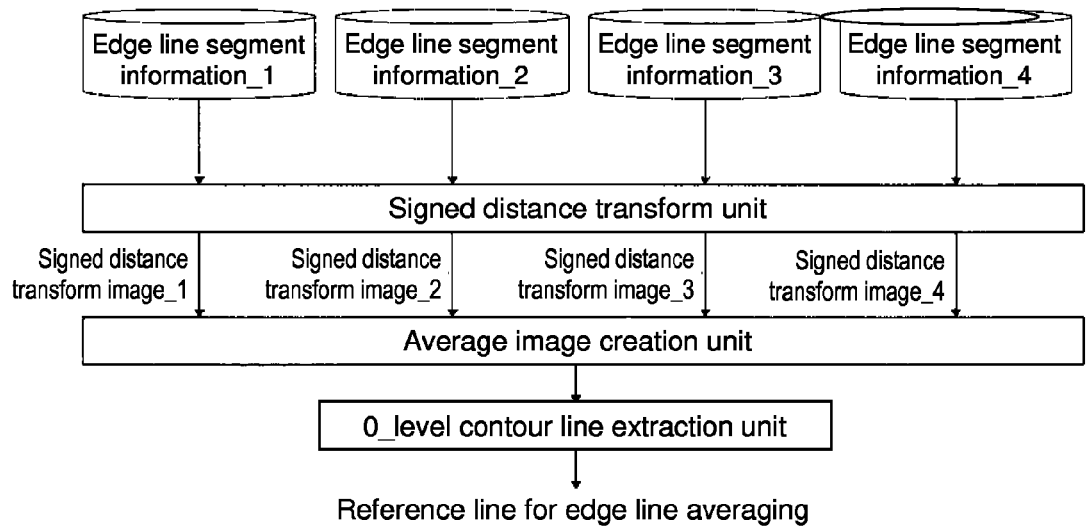
FIG. 42 illustrates an outline of a processing apparatus for determining a reference line for edge line averaging.

FIG. 42 shows a configuration in which design data are used after being modified by a pattern shape simulator. The edge line information is not limited to the edge line of the SEM pattern or design data, and any type of edge line may be used, such as that of an ideal golden pattern.

FIG. 42 shows a configuration of an apparatus for averaging edge lines or obtaining a reference line for averaging from four pieces of edge line segment information (the reference line will be described later). The signed distance transform image for each piece of the edge line segment information is created by signed distance transform, and an average image of the four images is created by an average image creation unit. The average image is an image with pixel values which are obtained by averaging the (four) pixel values of the corresponding pixels. A 0_Level contour line extraction unit determines the 0_Level contour line of the average image. The line has a shape corresponding to the average (average edge line) of the edge lines having the features of the four edge lines in an averaged manner. This may also be used as the reference line for averaging.

Figure 43:
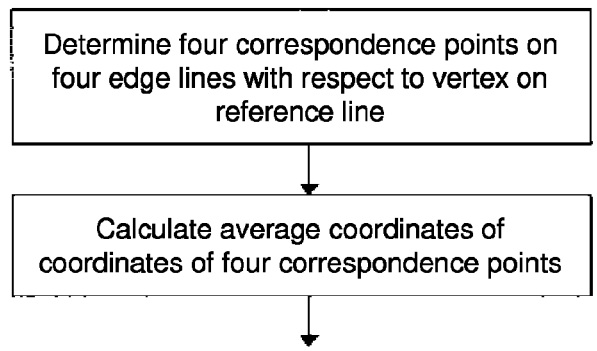
FIG. 43 illustrates a process of determining an average edge line on the basis of four correspondence points on a reference line.

As shown in FIG. 43, the average edge line may be determined by finding four correspondence points on the four edge lines that correspond to a vertex on a certain line used as the reference line such that the average coordinates of the four correspondence point correspond to the vertex of the edge line average. While the reference line is merely a foothold edge line for generating a correspondence relationship, the closer the reference line is to the edge line average, the higher the accuracy of averaging.

A predetermined average edge line may be effectively used as the reference line. It is also effective to repeat the process of determining a new average edge line by using an average edge line as a reference line.

While four edge lines have been averaged by way of example, the number of the edge lines is not particularly limited.

Thus, the method involving changing the line segment direction (shape) for determining the correspondence points on the basis of the grad direction may be considered as involving changing the position (the line segment direction for determining the correspondence points) of the two correspondence points (the first correspondence point and the second correspondence point set on the two edge lines) in accordance with the shape difference between two edge lines (line segments). As shown in FIG. 11 by way of example, the interpolation lines formed between the edge line 1 (first line segment) and the edge line 2 (the second line segment) indicate the transition of the change in the line shape from the first line segment to the second line segment, and the shape (direction) of the flow lines is changed along the transition of change.

Figure 44:
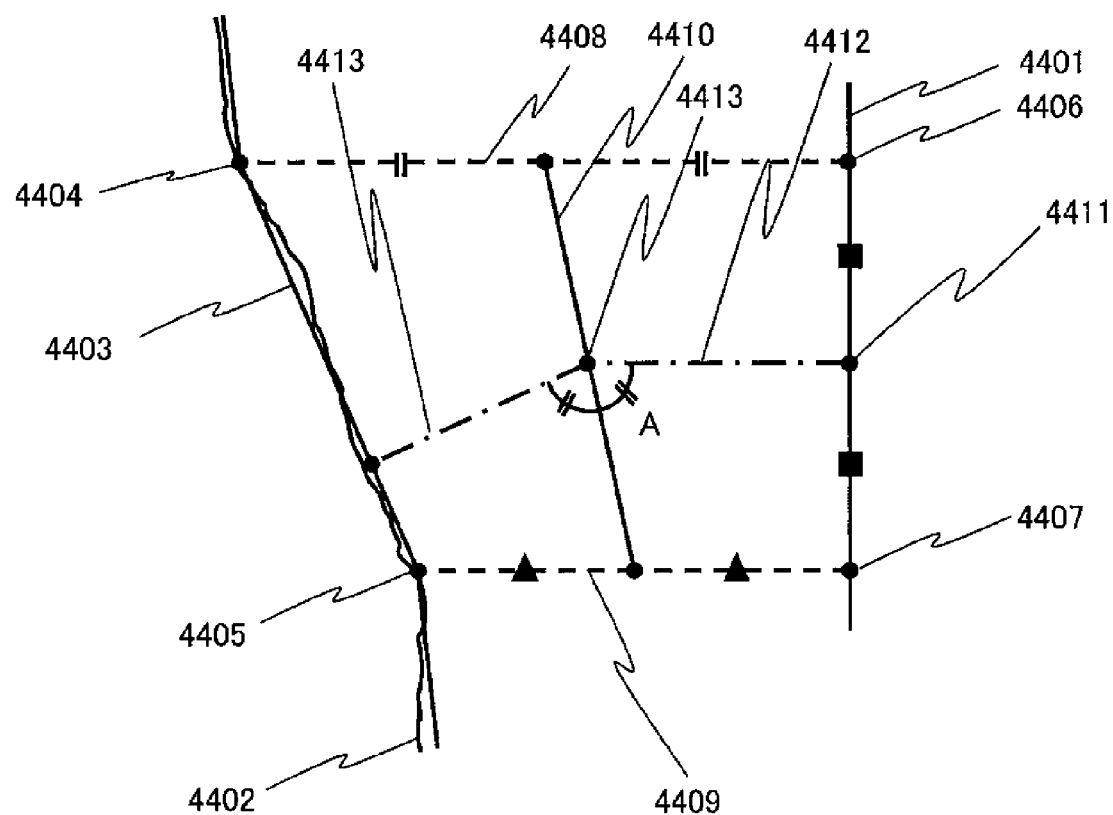
FIG. 44 illustrates an example of a method for identifying correspondence points.
Figure 48:
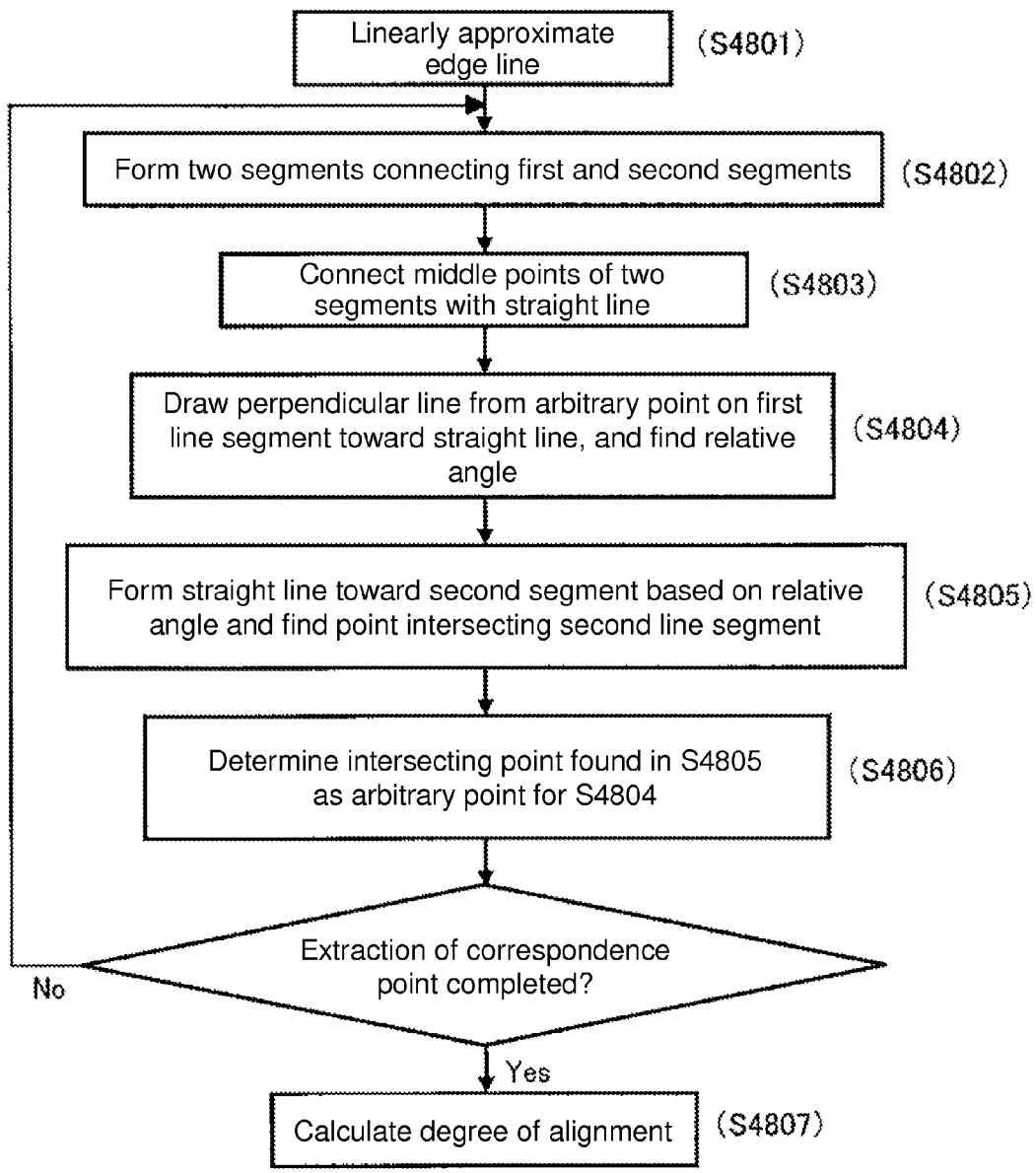
FIG. 48 is a flowchart of a process of extracting a correspondence point on the basis of linear approximation of an edge line.

FIG. 44 illustrates another method for setting a line segment (third line segment) corresponding to a flow line. While in the present example the third line segment is formed between design data (layout data) 4401 and an edge line 4402, this is merely exemplary, and the third line segment may be formed between edge lines. FIG. 48 is a flowchart of the process of forming the third line segment. First, an approximate edge line 4403 is formed by linear approximation of the edge line (step 4801). For linear approximation, a known method may be applied. Then, line segments 4408 and 4409 are formed between arbitrary two points (4404 and 4405) on the linearly approximated line segment 4403 and points 4406 and 4407 on the design data 4401 at the same height positions as the two arbitrary points on the Y-axis (step 4802).

Next, the middle points of the line segments 4408 and 4409 are connected by a line segment 4410 (step 4803). Then, an angle A is determined that is obtained when a perpendicular line (line segment 4412) is drawn from an arbitrary point (middle point 4411) between the points 4406 and 4407 to the line segment 4410 (step 4804). Then, a line segment 4413 is drawn from the point of intersection of the line segments 4410 and 4412 in a direction at the angle A with respect to the line segment 4410 to find a point of intersection 4414 with the line segment 4403 (step 4805). Then, the point of intersection 4414 is set as the correspondence point for the middle point 4411 (step 4806). Extraction of such correspondence point is performed for each approximate linear line, and, after the setting is completed, the degree of alignment is calculated on the basis of the distance information between the correspondence points (step 4807).

In the present example, the line segments 4412 and 4413 are line segments corresponding to the flow lines, and the correspondence points are defined by forming such line segments.

By the above method, too, the correspondence points can be found with a certain degree of accuracy. For areas where a plurality of third line segments may intersect one another, such a corner portion of a pattern, when another third line segment is included in the two-dimensional space defined by the line segment design data 4401 and the line segments 4403, 4408, and 4409, for example, the correspondence point determined by the other third line segment may be excluded from the calculation of the degree of alignment.

When third line segments intersect one another, one of them may be excluded from the computation of the degree of alignment. In this case, a process may be considered such that the correspondence points identified by the longer of the intersecting third line segments may not be applied for the calculation of the degree of alignment. Further, a process may be considered such that the correspondence points identified by one of the intersecting third line segments that exceeds a predetermined length is not applied for the calculation of the degree of alignment. These processes are very effective because a long third line segment may indicate that the correspondence point is set at a location that is not a valid correspondence point. When two or more line segments 4410 are used, the correspondence points can be determined with higher accuracy.

REFERENCE SIGNS LIST

4501 Data managing apparatus
4502, 4503 SEM
4504, 4505 Control apparatus
4506, 4507 Communication line
4508 Simulator

The invention claimed is:

1. An image processing apparatus comprising:
a computer; and
a memory for storing a program causing the computer to perform as a positioning process unit for performing positioning between a first pattern formed by a first line segment and a second pattern formed by a second line segment, wherein
the positioning process unit is further configured to:
set a first correspondence point and a second correspondence point on the first line segment and the second line segment, respectively,
calculate a degree of alignment for the positioning of the first pattern and the second pattern on the basis of the distance between the first correspondence point and the second correspondence point, and
change the position of the first correspondence point in accordance with a shape difference between the first line segment and the second line segment.

2. The image processing apparatus according to claim 1, wherein the positioning process unit is further configured to:
set the first correspondence point and the second correspondence point on a third line segment connecting the first and the second line segments at points of intersection with the first line segment and the second line segment, and
change the position of the first correspondence point and/or the second correspondence point set on the third line segment by changing the shape of the third line segment in accordance with the shape difference between the first line segment and the second line segment.

3. The image processing apparatus according to claim 1, wherein
the first line segment includes line segment information obtained on the basis of design data, and
the second line segment includes edge line information obtained from an image acquired by a charged particle beam apparatus.

4. The image processing apparatus according to claim 3, wherein the first line segment includes line segment information obtained by performing a simulation process for the design data.

5. The image processing apparatus according to claim 1, wherein the positioning process unit is further configured to:
set an interpolation line between the first line segment and the second line segment on the basis of shape information of the first line segment and the second line segment,
set a third line segment intersecting the interpolation line at a predetermined angle, and
set a point of intersection of the third line segment with the first line segment and the second line segment as the first correspondence point and the second correspondence point.

6. The image processing apparatus according to claim 5, wherein the interpolation line has an intermediate shape obtained by gradually changing the line segment shape from the first line segment toward the second line segment.

7. The image processing apparatus according to claim 1, wherein the positioning process unit sets points of intersection of a flow line of a vector field formed on the basis of the first line segment and the second line segment with the first line segment and the second line segment as the first correspondence point and the second correspondence point.

8. The image processing apparatus according to claim 7, wherein the positioning process unit forms a signed distance transform image on the basis of the first line segment and the second line segment.

9. The image processing apparatus according to claim 8, wherein the positioning process unit forms an interpolation line disposed between the first line segment and the second line segment on the basis of computation of a weighted mean of a signed transform image.

10. The image processing apparatus according to claim 7, wherein the positioning process unit calculates a shift amount such that the sum of squares of the length of projection of the distance between the first correspondence point and the second correspondence point on the vector field is minimized.

11. The image processing apparatus according to claim 1, wherein the positioning process unit calculates a rotation amount and a shift amount used for the positioning separately.

12. The image processing apparatus according to claim 1, wherein the positioning process unit searches a search interval of the degree of alignment for a minimum position of an object function.

13. The image processing apparatus according to claim 12, wherein the positioning process unit calculates the minimum position outside the search interval by interpolation.

14. The image processing apparatus according to claim 1, wherein the positioning process unit identifies a minimum position by the least-square method and then searches around the minimum position for a point with the minimum dispersion.

15. The image processing apparatus according to claim 1, wherein the positioning process unit uses the least-square method by using the interval between vertexes as a weight.

16. A non-transitory tangible computer readable medium having a computer program for causing a computing apparatus to perform positioning between a first pattern formed by a first line segment and a second pattern formed by a second line segment,
wherein the program causes the computing apparatus to:
set a first correspondence point and a second correspondence point on the first line segment and the second line segment, respectively;
calculate the degree of alignment for the positioning of the first pattern and the second pattern on the basis of the distance between the first correspondence point and the second correspondence point; and change the position of the first correspondence point in accordance with a shape difference between the first line segment and the second line segment.

17. The non-transitory tangible computer readable medium according to claim 16, wherein the program causes the computing apparatus to:
set the first correspondence point and the second correspondence point on a third line segment connecting the first and the second line segments at points of intersection with the first line segment and the second line segment; and
change the position of the first correspondence point and/or the second correspondence point set on the third line segment by changing the shape of the third line segment in accordance with the shape difference between the first line segment and the second line segment.

18. The non-transitory tangible computer readable medium according to claim 16, wherein the program causes the computing apparatus to:
set an interpolation line between the first line segment and the second line segment on the basis of shape information of the first line segment and the second line segment;
set a third line segment intersecting the interpolation line at a predetermined angle; and
set a point of intersection of the third line segment with the first line segment and the second line segment as the first correspondence point and/or the second correspondence point.

19. The non-transitory tangible computer readable medium according to claim 18, wherein the interpolation line has an intermediate shape obtained by gradually changing the line segment shape from the first line segment toward the second line segment.

* * * * *